(12) United States Patent
Hashimoto et al.

(10) Patent No.: US 7,504,682 B2
(45) Date of Patent: Mar. 17, 2009

(54) POLARIZATION TRANSFER DEVICE AND CONTROL METHOD THEREFOR

(75) Inventors: Masami Hashimoto, Hino (JP); Takeshi Kijima, Matsumoto (JP); Yasuaki Hamada, Suwa (JP); Akio Konishi, Shiogiri (JP); Tatsuya Shimoda, Nomi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/653,231

(22) Filed: Jan. 16, 2007

(65) Prior Publication Data

US 2007/0170479 A1   Jul. 26, 2007

(30) Foreign Application Priority Data

Jan. 25, 2006   (JP) .............................. 2006-016068

(51) Int. Cl.
*H01L 27/115* (2006.01)
(52) U.S. Cl. .............................. 257/295; 438/3; 438/197
(58) Field of Classification Search ................. 257/295; 438/3, 197
See application file for complete search history.

(56) References Cited

U.S. PATENT DOCUMENTS

| | | | | |
|---|---|---|---|---|
| 3,531,182 A | * | 9/1970 | Schueler et al. ............. 359/252 |
| 3,564,515 A | * | 2/1971 | Land et al. .................. 365/157 |
| 5,926,413 A | | 7/1999 | Yamada et al. | |
| 5,986,298 A | * | 11/1999 | Yoo ............................ 257/295 |
| 6,087,688 A | | 7/2000 | Furuta et al. | |
| 6,711,049 B1 | | 3/2004 | Hsu et al. | |

FOREIGN PATENT DOCUMENTS

| | | |
|---|---|---|
| JP | A 11-39882 | 2/1999 |
| JP | A 11-177036 | 7/1999 |
| JP | A 11-251586 | 9/1999 |
| JP | A 2004-153239 | 5/2004 |

* cited by examiner

*Primary Examiner*—Jerome Jackson, Jr.
*Assistant Examiner*—Jami M Valentine
(74) *Attorney, Agent, or Firm*—Oliff & Berridge, PLC

(57) ABSTRACT

A polarization transfer device includes a ferroelectric thin film formed continuously as one piece; a plurality of polarization switches formed by placing the ferroelectric thin film between a first gate electrode and a second gate electrode; and a plurality of polarization accumulators formed by placing the ferroelectric thin film between a first electrode plate and a second electrode plate, wherein the plurality of polarization switches and the plurality of polarization accumulators are arranged alternately.

4 Claims, 36 Drawing Sheets

FIG.13A1
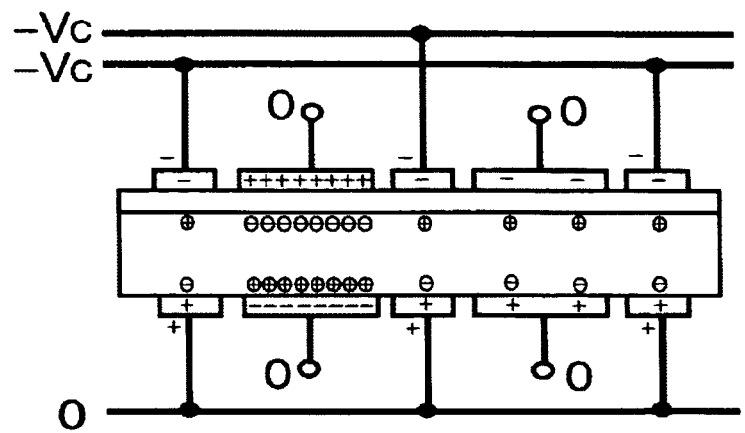
FIG.13B1
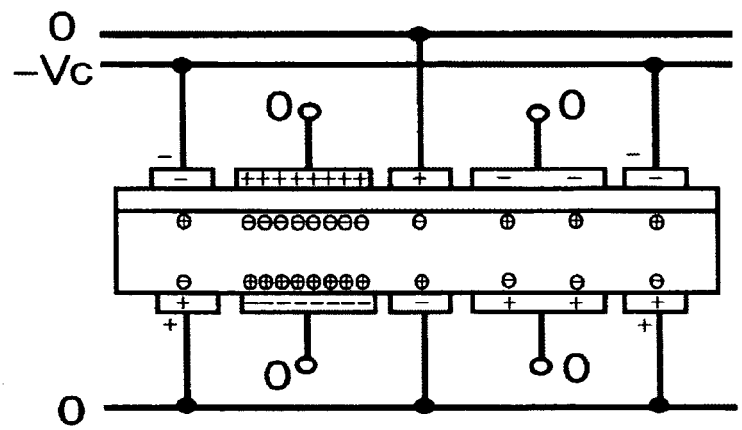
FIG.13C1
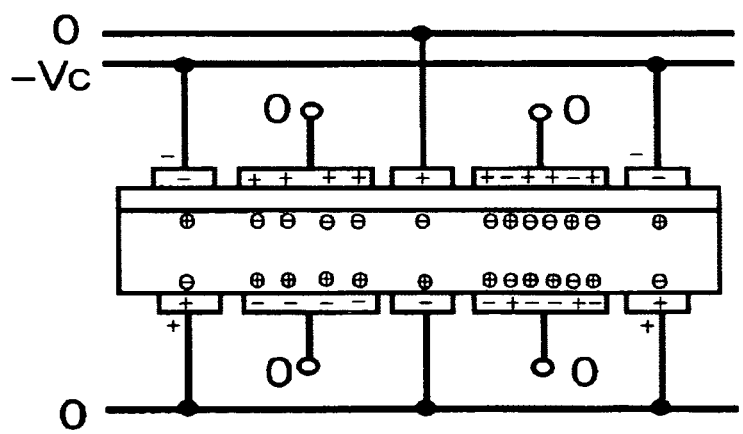

*FIG. 14D1*
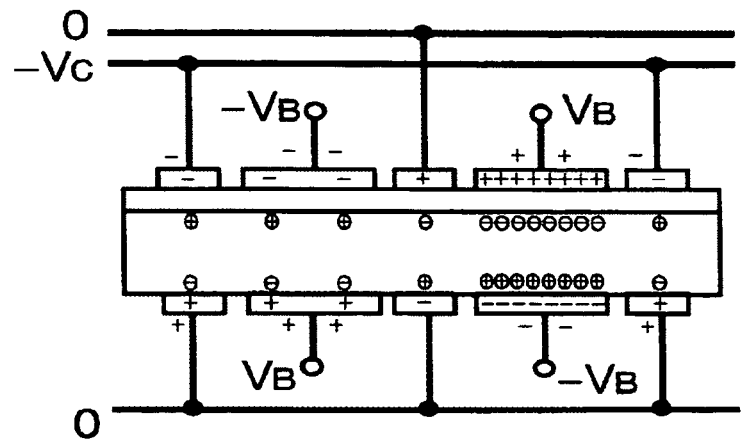
*FIG. 14E1*
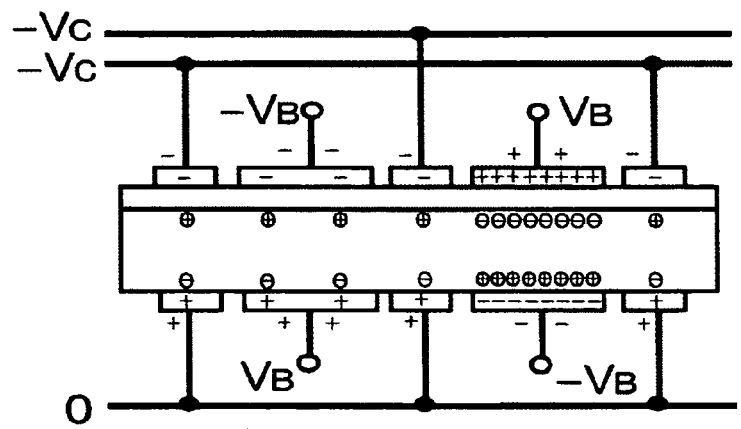
*FIG. 14F1*
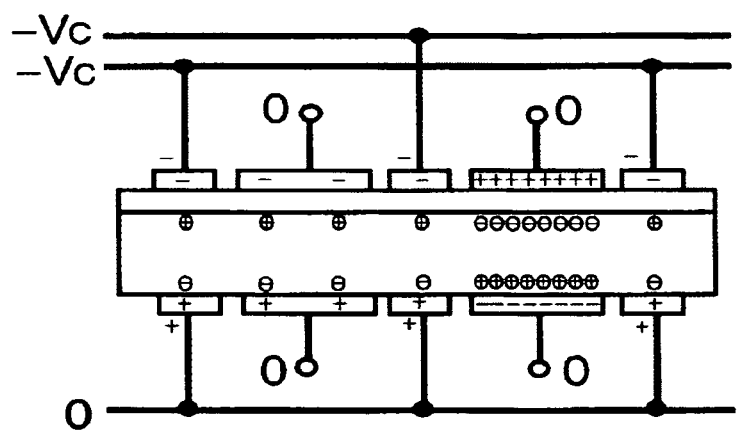

*FIG. 15G1*
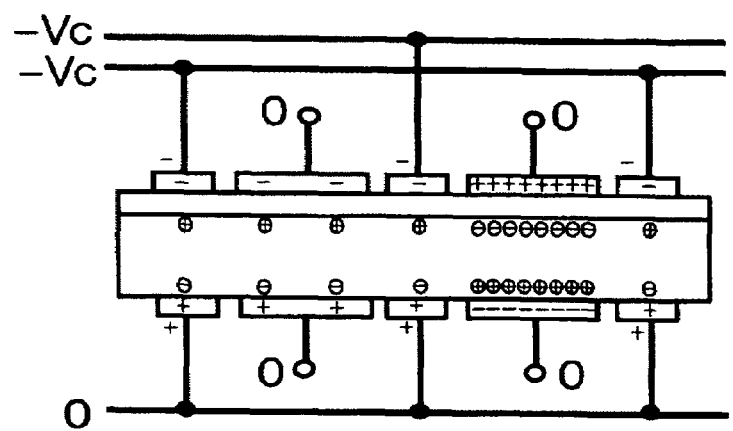
*FIG. 15H1*
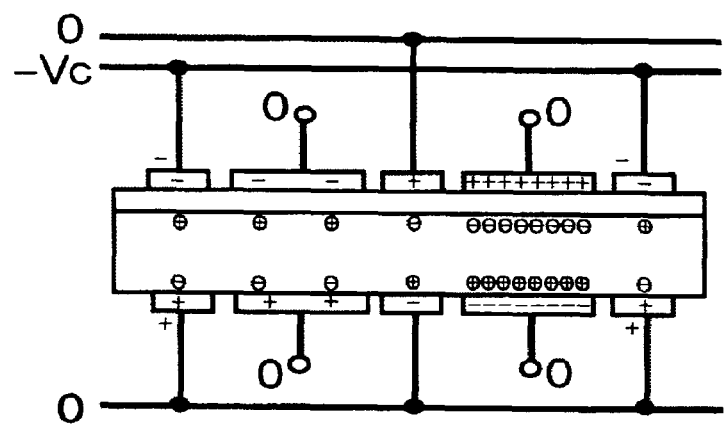
*FIG. 15I1*
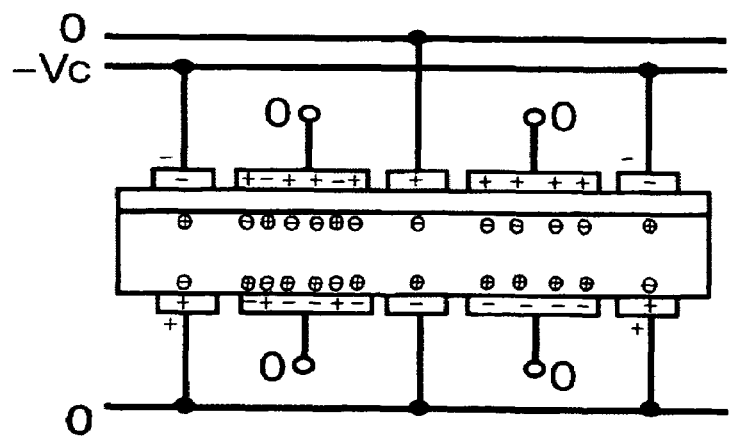

*FIG. 16J1*
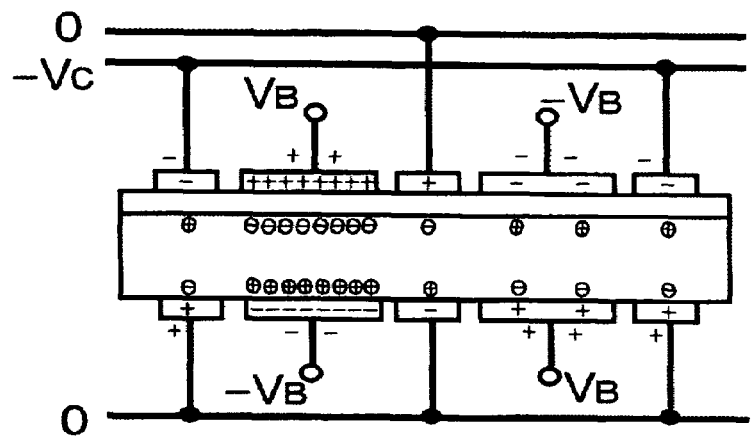
*FIG. 16K1*
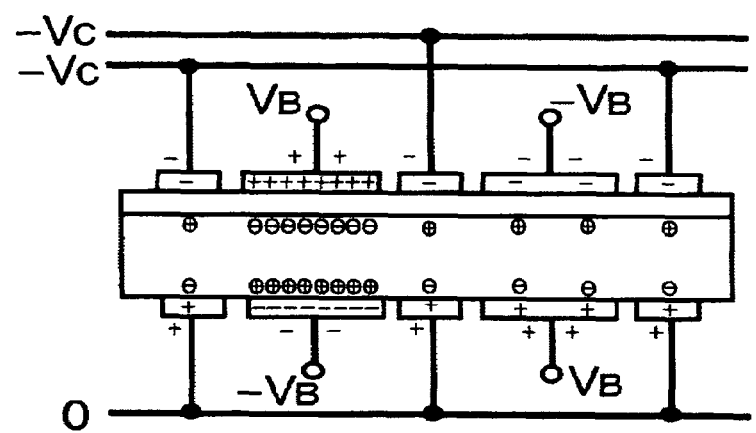
*FIG. 16L1*
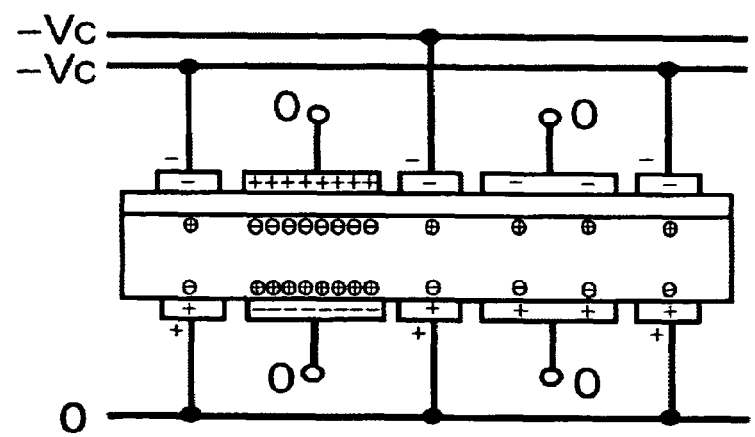

FIG. 17A2
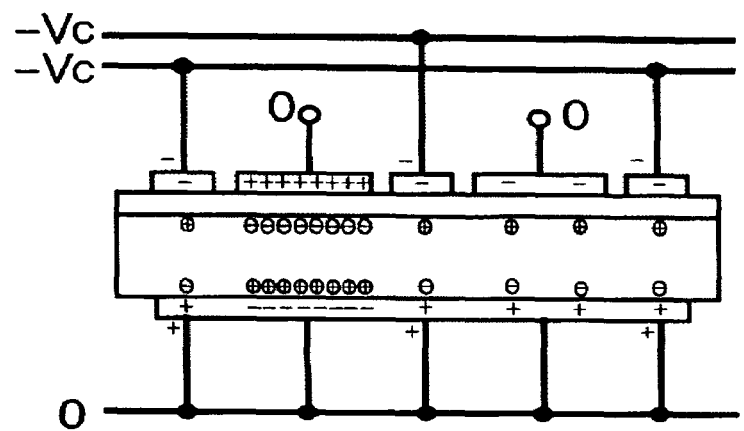
FIG. 17B2
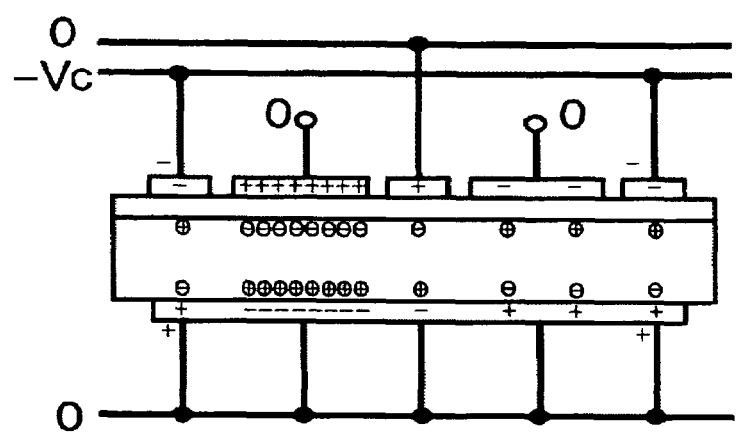
FIG. 17C2
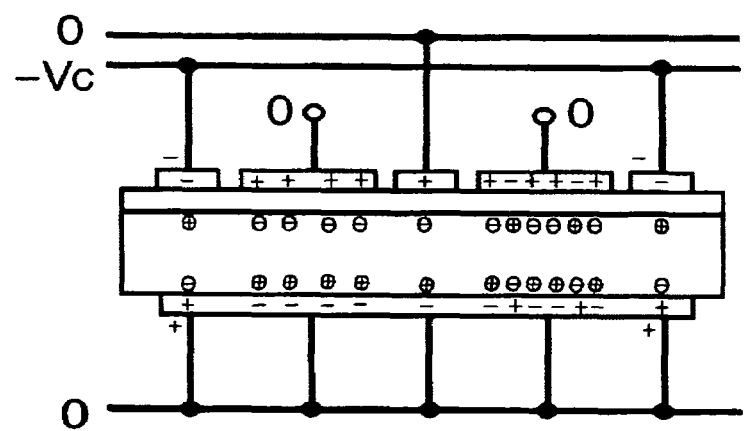

*FIG.18D2*
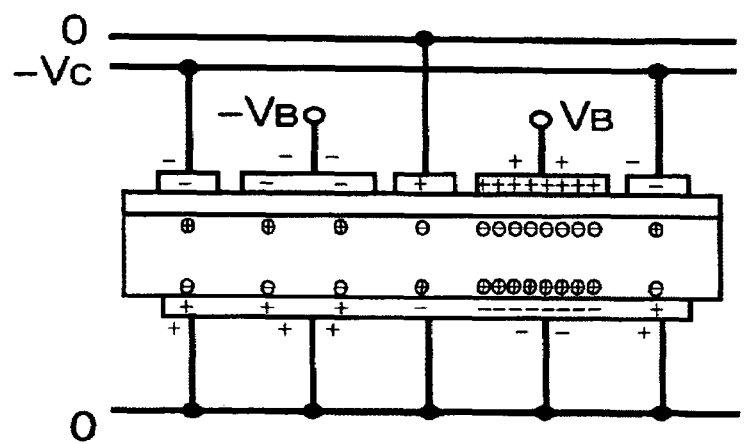
*FIG.18E2*
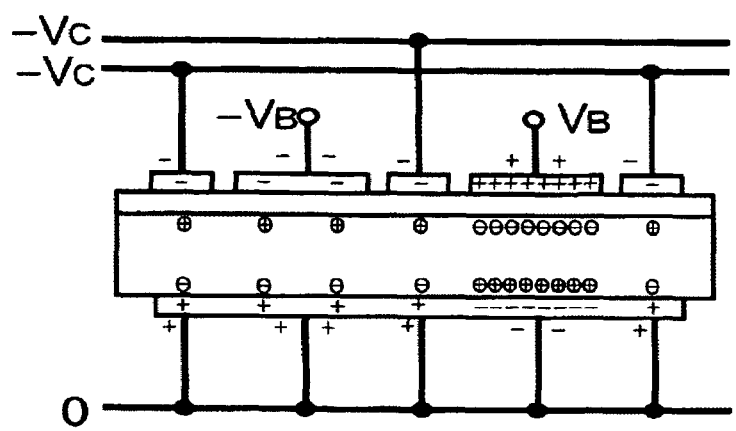
*FIG.18F2*
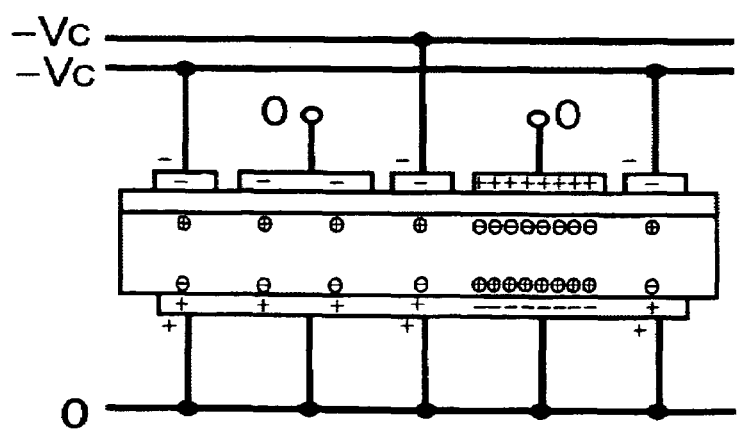

*FIG. 19G2*
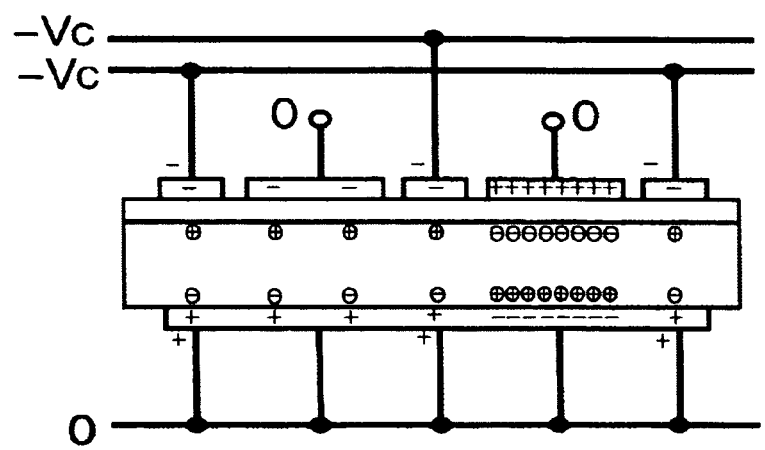
*FIG. 19H2*
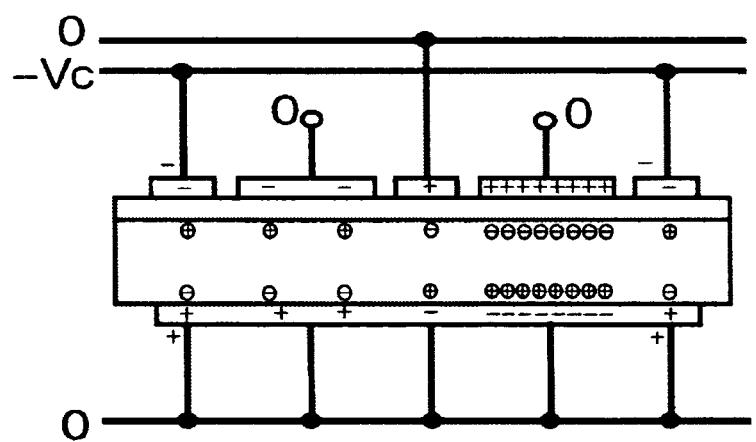
*FIG. 19I2*
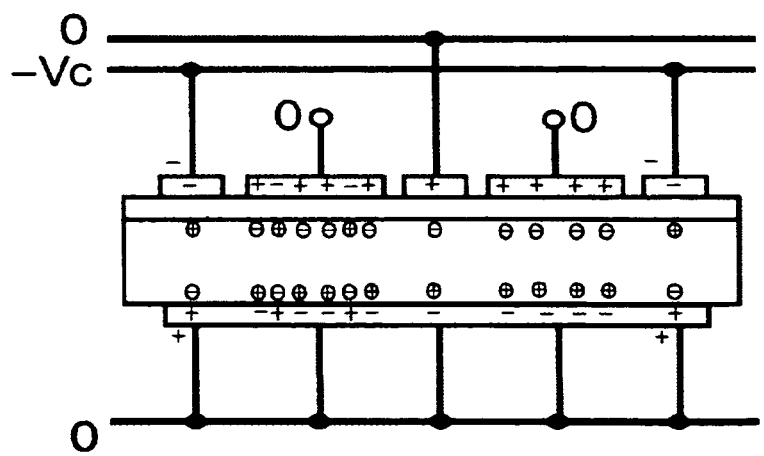

*F I G. 2 0 J 2*
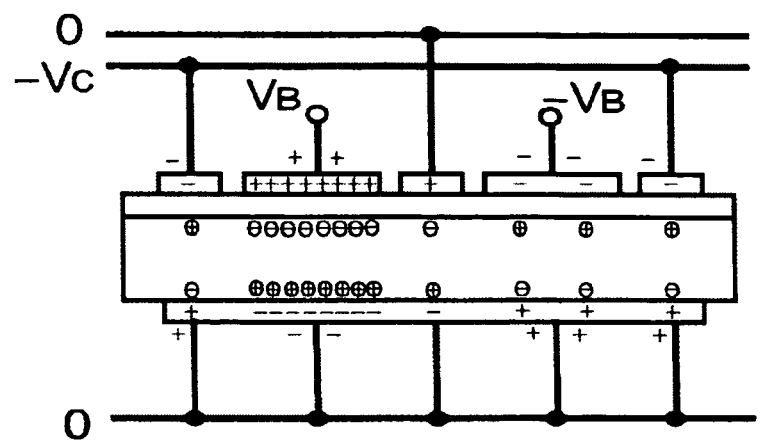
*F I G. 2 0 K 2*
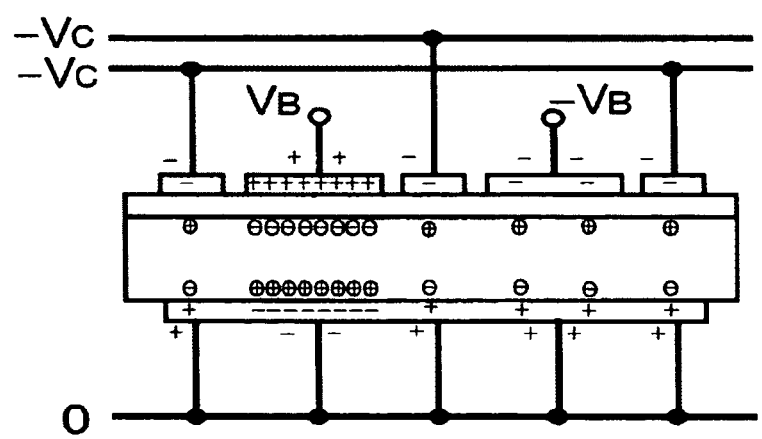
*F I G. 2 0 L 2*
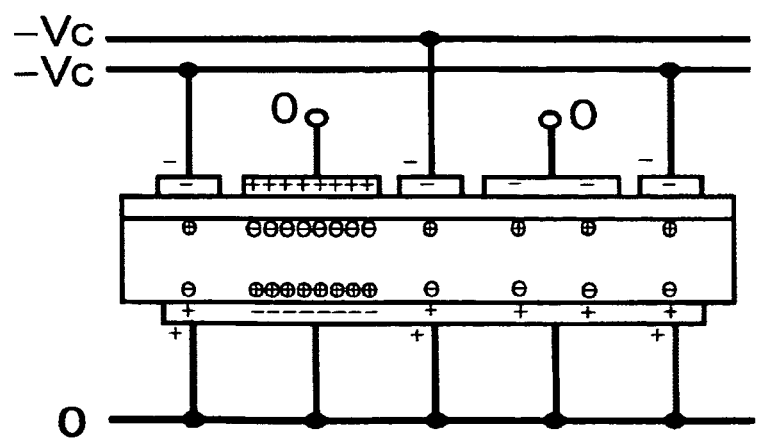

*FIG. 21A3*
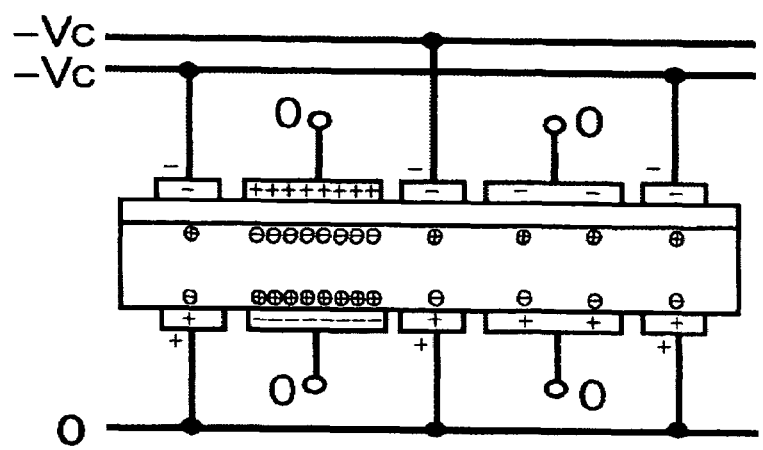
*FIG. 21B3*
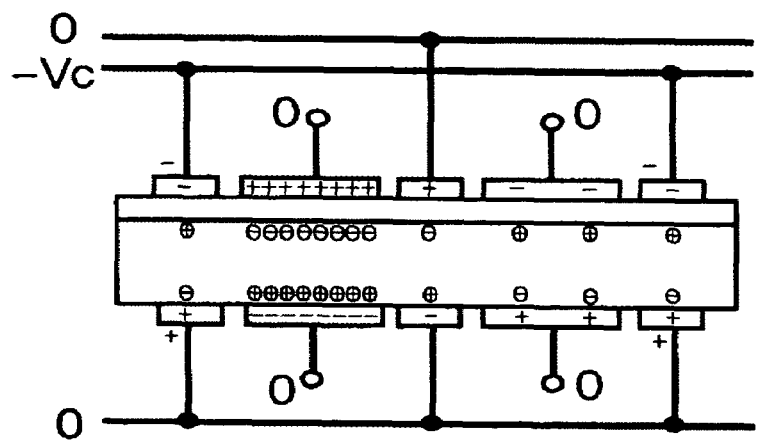
*FIG. 21C3*
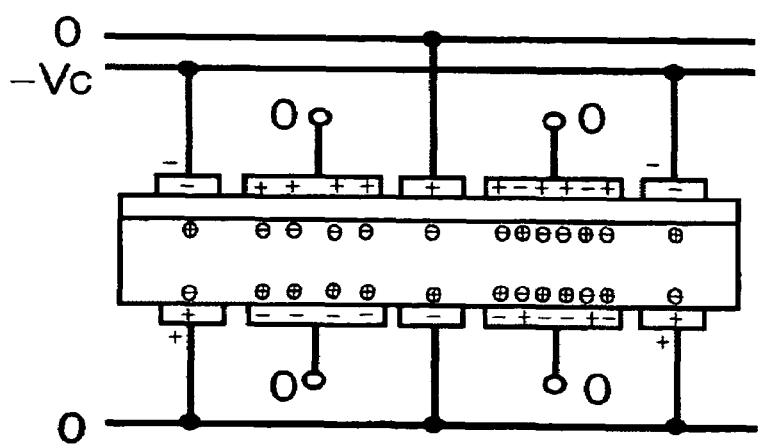

*FIG.22D3*
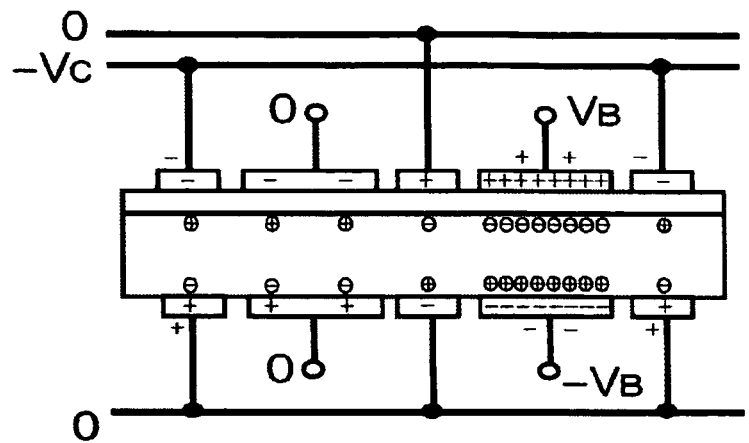
*FIG.22E3*
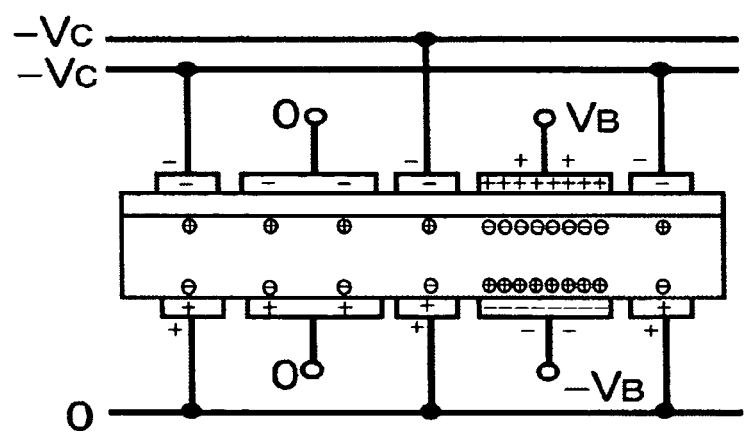
*FIG.22F3*
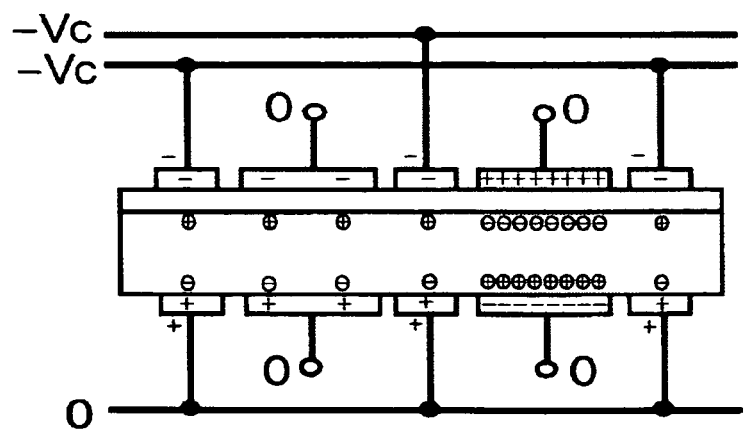

F I G. 23A4
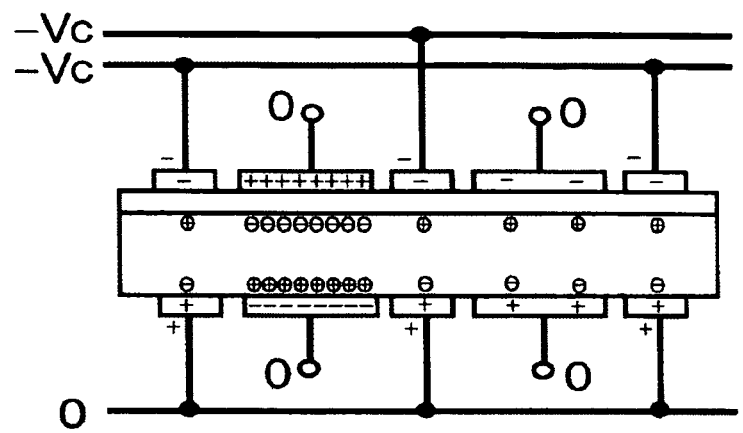
F I G. 23B4
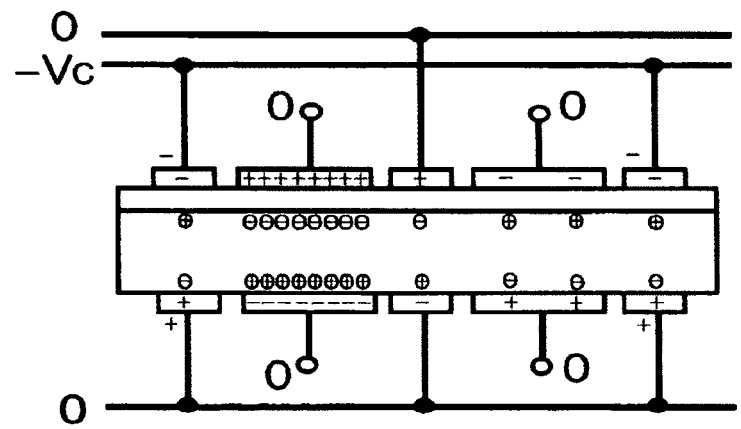
F I G. 23C4
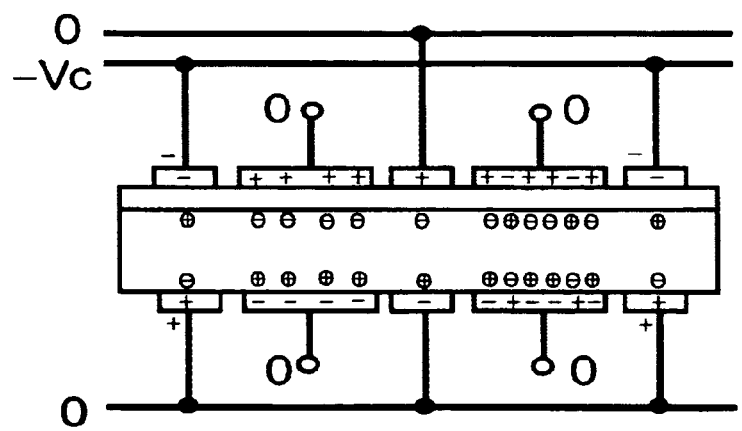

FIG.24D4
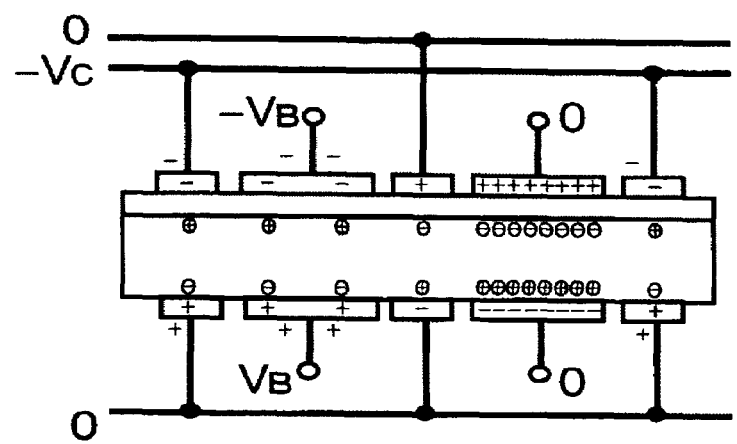
FIG.24E4
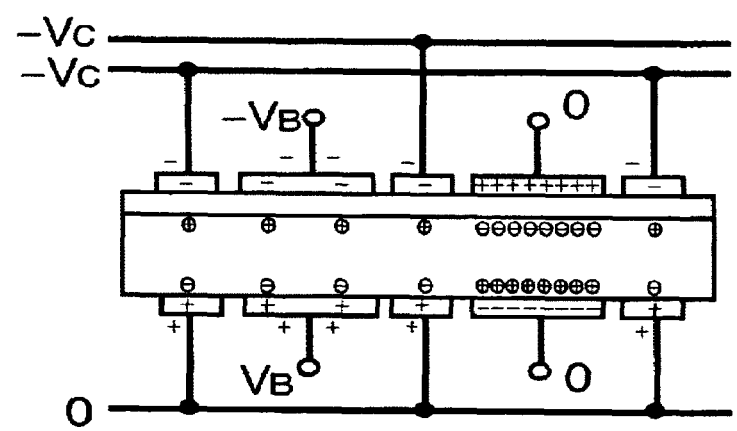
FIG.24F4
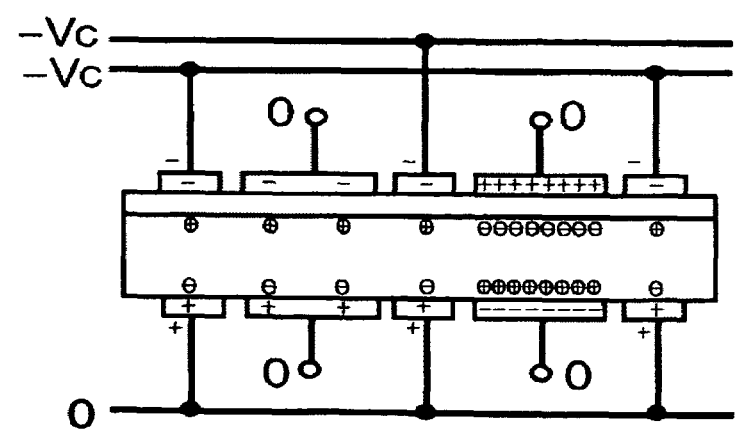

4601

POLARIZATION TRANSFER DEVICE AND CONTROL METHOD THEREFOR

The entire disclosure of Japanese Patent Application No. 2006-016068, filed Jan. 25, 2006 is expressly incorporated by reference herein.

BACKGROUND

1. Technical Field

The present invention relates to the field of devices which use non-volatility of ferroelectric material. More particularly, it relates to a configuration of a functional block which acts as an element of device configuration to transfer polarization when using polarization of ferroelectric material as memory elements.

2. Related Art

Recently, in the field of memories, non-volatile memories which are electrically writable and erasable have been growing in importance. There are various types of non-volatile memory, but ferroelectric memories have been receiving attention because of their high speed, low voltage characteristics, and low power consumption.

For example, as shown in FIG. 43, a ferroelectric thin film 4340 is placed between an electrode 4341 and electrode 4342 to form a ferroelectric capacitor 4349, which is used as an element of a memory cell. Besides, there is a so-called 1T1C (1-transistor, 1-capacitor) ferroelectric memory, in which a memory cell consists of an insulated-gate field effect transistor 4412 and ferroelectric capacitor 4411 and the groups of the memory cells are arranged in a matrix on word lines 4413, bit lines 4414, and plate lines 4415 as shown in FIG. 44.

FIG. 42 is a characteristic curve showing a relationship between applied voltage of the ferroelectric capacitor 4349 indicated by a broken line in FIG. 43 or the ferroelectric thin film 4340 and internal polarization. In FIG. 42, when an applied voltage V is applied, reverse polarity polarization is induced in the ferroelectric thin film. This state corresponds to characteristic point 4204. Subsequently, even if the applied voltage is reduced to 0, residual polarization remains in the ferroelectric thin film, resulting in characteristic point 4205. Then, when a voltage is applied in the positive direction, the residual polarization disappears, resulting in characteristic point 4206. Then, when the applied voltage is changed to −V, reverse polarity polarization is induced, resulting in characteristic point 4201. Then, even if the applied voltage becomes 0, residual polarization remains in the ferroelectric thin film, resulting in characteristic point 4202. Then, when a voltage is applied in the positive direction, the residual polarization disappears, resulting in characteristic point 4203. Then, when a positive voltage V is applied, the characteristic curve returns to characteristic point 4204. Thus, as can be seen from the characteristic curve in FIG. 42, ferroelectric material presents hysteresis characteristics depending on the applied direction and history of the applied voltage. Also, the polarization induced by the application of a voltage is retained as residual polarization even if the applied voltage is reduced to 0. The residual polarization does not disappear even if a voltage is applied in the reverse direction, provided that the voltage does not exceed coercive voltage. The above-mentioned hysteresis characteristics and residual polarization feature of ferroelectric material are used for non-volatile memories.

FIG. 45 is a sectional view showing a structure of a ferroelectric transistor which is formed as a field effect transistor consisting of a gate electrode 4501, source electrode 4502, drain electrode 4503, and bulk or channel 4509, and which is provided with a ferroelectric thin film 4500 formed directly underneath the gate electrode 4501. In the ferroelectric transistor in FIG. 45, a threshold voltage of the field effect transistor changes with the polarity and magnitude of the residual polarization of the ferroelectric thin film 4500, causing a source-drain current to change.

Also, there is a ferroelectric memory which makes use of a principle in detecting the residual polarization stored in the ferroelectric thin film 4500 based on difference in the value of current flowing through a ferroelectric transistor 4601 selected according to its address from among ferroelectric transistors as shown in FIG. 45 arranged in a matrix as shown in FIG. 46.

Also, there are various other types of ferroelectric memory. However, most of them use either a combination of ferroelectric capacitors and insulated-gate field effect transistors or field effect transistors with a ferroelectric thin film formed in the gate. Thus, they are regarded as basically similar kind and similar type in principle.

Incidentally, an example in which a ferroelectric capacitor 4349 or 4411 (such as shown FIG. 43 or FIG. 44) and insulated-gate field effect transistor 4412 are combined to be used as a memory element is disclosed in JP-A-11-39882. A similar example is disclosed in JP-A-11-177036 although it differs in the method for connecting the ferroelectric capacitor and insulated-gate field effect transistor.

Also, examples in which a field effect transistor 4601 with a ferroelectric thin film formed in the gate shown FIG. 45 or FIG. 46 is used as a memory element are disclosed in JP-A-11-251586 and JP-A-2004-153239.

However, in any of JP-A-11-39882, JP-A-11-177036, JP-A-11-251586, and JP-A-2004-153239, when using as the ferroelectric capacitor or field effect transistor with a ferroelectric thin film formed in the gate, elements must be made independent of each other. For that, the ferroelectric thin film must be separated element by element. Therefore, a technique has been adopted in which the ferroelectric thin film is cut chemically or physically or grown in small areas in isolation. Ferroelectric material varies greatly in characteristics at end points of crystals. Thus, in conventional configuration of ferroelectric memory, when a memory cell is miniaturized to increase the packing density of the device, the ferroelectric thin film must be reduced in size accordingly. However, the characteristics of the ferroelectric material may change with miniaturization as described above. As a result, there are problems that this makes it difficult to accomplish miniaturizing by means of miniaturization, and makes it difficult in turn to achieve high capacity and reduce costs.

SUMMARY

To solve the above problem, the present invention has an object to maintain characteristics of ferroelectric material high, good and stable regardless of miniaturization or packing density using a ferroelectric thin film formed continuously as one piece. Also, it has an object to provide a ferroelectric memory device with high packing density, high capacity, and low costs by reducing its dimensions (design size) by means of making these characteristics stable.

To solve the above problem and achieve the above objects, the present invention has the following aspects.

According to a first aspect of the present invention, there is provided a polarization transfer device comprising: a ferroelectric thin film formed continuously as one piece; a plurality of polarization switches formed by placing the ferroelectric thin film between a first gate electrode and a second gate electrode; and a plurality of polarization accumulators formed by placing the ferroelectric thin film between a first electrode plate and a second electrode plate, wherein the plurality of polarization switches and the plurality of polarization accumulators are arranged alternately.

According to a second aspect of the present invention, in the first aspect, the first gate electrode of the plurality of polarization switches and the first electrode plate of the plurality of polarization accumulators are constituted of a continuous common electrode.

According to a third aspect of the present invention, in the first or second aspect, the second gate electrode of the plurality of polarization switches and the second electrode plate of the plurality of polarization accumulators are formed in different manufacturing processes.

According to a fourth aspect of the present invention, in the second aspect, the continuous common electrode is made of platinum.

According to a fifth aspect of the present invention, in the first aspect, an insulating layer made of paraelectric material is provided between the ferroelectric thin film and the second electrode of the plurality of polarization switches as well as between the ferroelectric thin film and the second electrode plate of the plurality of polarization accumulators.

According to a sixth aspect of the present invention, in the first aspect, a first insulating layer made of paraelectric material is provided between the ferroelectric thin film and the second electrode of the plurality of polarization switches; a second insulating layer made of paraelectric material is provided between the ferroelectric thin film and the second electrode plate of the plurality of polarization accumulators; and the first insulating layer and the second insulating layer differ in dielectric constant.

According to a seventh aspect of the present invention, in the fifth aspect, the paraelectric material of the insulating layer is nickel oxide.

According to an eighth aspect of the present invention, in the first aspect, the ferroelectric thin film is made of PZTN, PZT, or SBT.

According to a ninth aspect of the present invention, a transfer control method controls the polarization transfer device in the first or second aspect, wherein a control voltage applied between the first gate electrode and the second gate electrode of the polarization switches and a control voltage applied between the first electrode plate and the second electrode plate of the polarization accumulators are not higher than coercive voltage of the ferroelectric thin film.

According to a tenth aspect of the present invention, a transfer control method controls the polarization in the first or second aspect, wherein a control signal is given so as to apply a voltage between the first electrode plates and/or between the second electrode plates of adjacent first and second polarization accumulators among the plurality of polarization accumulators in such a way as to attract or repel polarization of signals in a direction of transfer.

The present invention, configured as described above, provides stable characteristics because the ferroelectric thin film is formed continuously as one piece.

Also, the present invention, which accumulates and transfer polarized signals in the ferroelectric thin film, makes signals non-volatile and allows a write circuit or signal detection circuit to be shared, and thereby increases packing efficiency.

Also, even if control signals and the metal electrodes of the polarization accumulators are miniaturized, the ferroelectric thin film occupies a large area all the same. Consequently, the present invention gives the ferroelectric thin film stable characteristics which is important for non-volatile memories and makes it relatively easy to achieve miniaturization and high packing density.

Thus, the present invention provides a high-density, high-capacity, low-cost ferroelectric memory with stable characteristics.

BRIEF DESCRIPTION OF THE DRAWINGS

FIGS. 13A1, 13B1 and 13C1 are first state diagrams of polarized signals when the polarization transfer device according to the present invention is operated using control signals of a first example;

FIGS. 14D1, 14E1 and 14F1 are second state diagrams of polarized signals when the polarization transfer device according to the present invention is operated using control signals of the first example;

FIGS. 15G1, 15H1 and 15I1 are first state diagrams of polarized signals when the polarization transfer device according to the present invention is operated using control signals of a second example;

FIGS. 16J1, 16K1 and 16L1 are second state diagrams of polarized signals when the polarization transfer device according to the present invention is operated using control signals of the second example;

FIGS. 17A2, 17B2 and 17C2 are first state diagrams of polarized signals when the polarization transfer device according to the present invention is operated using control signals of a seventh example;

FIGS. 18D2, 18E2 and 18F2 are second state diagrams of polarized signals when the polarization transfer device according to the present invention is operated using control signals of the seventh example;

FIGS. 19G2, 19H2 and 19I2 are first state diagrams of polarized signals when the polarization transfer device according to the present invention is operated using control signals of an eighth example;

FIGS. 20J2, 20K2 and 20L2 are second state diagrams of polarized signals when the polarization transfer device according to the present invention is operated using control signals of the eighth example;

FIGS. 21A3, 21B3 and 21C3 are first state diagrams of polarized signals when the polarization transfer device according to the present invention is operated using control signals of a third example;

FIGS. 22D3, 22E3 and 22F3 are second state diagrams of polarized signals when the polarization transfer device according to the present invention is operated using control signals of the third example;

FIGS. 23A4, 23B4 and 23C4 are first state diagrams of polarized signals when the polarization transfer device according to the present invention is operated using control signals of a fourth example;

FIGS. 24D4, 24E4 and 24F4 are second state diagrams of polarized signals when the polarization transfer device according to the present invention is operated using control signals of the fourth example;

DETAILED DESCRIPTION OF THE PREFERRED EMBODIMENTS

Before describing the embodiments of the present invention, physical phenomena related to ferroelectric polarization relevant to the present invention will be described to make it easier to understand the constitution of the present invention.

About Surface Potential and Polarization Movement

Figure 39:
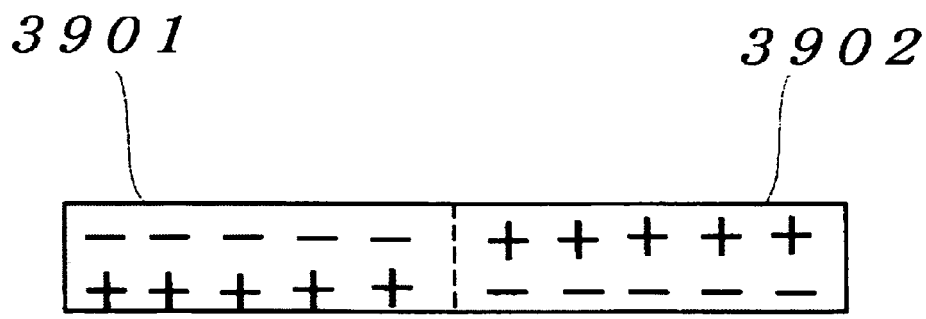
FIG. 39 is a state diagram showing an example of polarization of a ferroelectric material used in the present invention and a conventional example.

FIG. 39 shows an exemplary state of polarization of ferroelectric material. In FIG. 39, reference numerals 3901 and 3902 denote the left and right halves of a ferroelectric thin film. The left half 3901 is polarized with the lower part being positive and the upper part being negative. The right half 3902 is polarized with the lower part being negative and the upper part being positive. In this case, if the ferroelectric material has good crystallinity and good characteristics, even though the left half 3901 and right half 3902 are polarized in the reverse direction, they maintain the direction and magnitude of polarization separately.

Figure 40A:
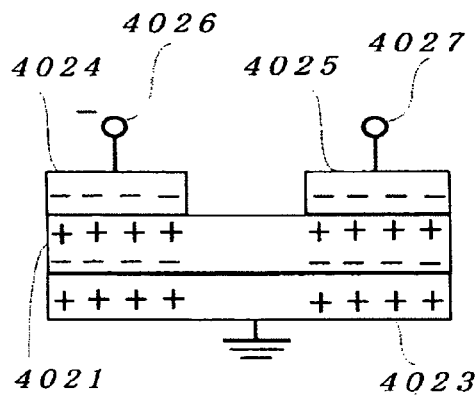
FIGS. 40A and 40B are state diagrams showing another example of polarization of a ferroelectric material used in the present invention and a conventional example.
Figure 40B:
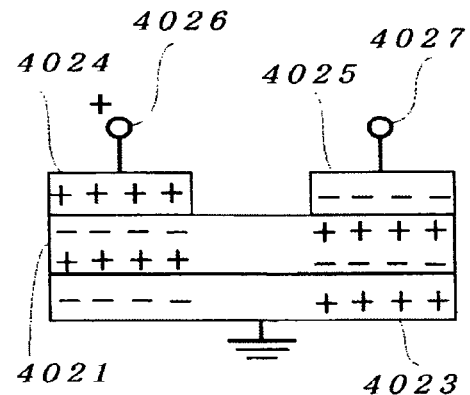

FIGS. 40A and 40B show a structure in which a ferroelectric thin film 4021 is sandwiched between lower electrode 4023 and upper electrode 4024 in the left part, and between lower electrode 4023 and upper electrode 4025 in the right part, where the lower electrode 4023 is common to the left and right parts. Incidentally, the lower electrode 4023 is at ground potential. On the other hand, a potential is applied to the upper electrode 4024 via a terminal 4026, and to the upper electrode 4025 via a terminal 4027. Referring to FIGS. 40A and 40B, a negative potential is applied to the right upper electrode 4025 to polarize the ferroelectric thin film directly underneath with the upper part being positive and the lower part being negative while allowing potential to discharge from the terminal 4027 and upper electrode 4025. Next, in FIG. 40A, a negative potential is applied to the left upper electrode 4024 to polarize the ferroelectric thin film directly underneath the upper electrode 4024 with the upper part being positive and the lower part being negative. In FIG. 40B, a positive potential is applied to the left upper electrode 4024 to polarize the ferroelectric thin film directly underneath the upper electrode 4024 with the upper part being negative and the lower part being positive. When the state of polarization of the ferroelectric thin film directly underneath the right upper electrode 4025 is checked via the terminal 4027, the state of the polarization of the ferroelectric thin film directly underneath the upper electrode 4025 remains the same as when a potential is applied first, i.e., the ferroelectric thin film directly underneath the right upper electrode 4025 is polarized with the upper part being positive and the lower part being negative both in FIGS. 40A and 40B. In other words, although the left and right parts of the ferroelectric material are polarized reversely, the polarization domain wall is retained and they remain separated from each other without interference both in the example of FIG. 39 and example of FIGS. 40A and 40B. The above is a well-known phenomenon of polarization of typical ferroelectric thin film.

However, under other conditions, there are cases in which a phenomenon is sometimes observed where the above polarization domain wall is not retained.

Figure 41C:
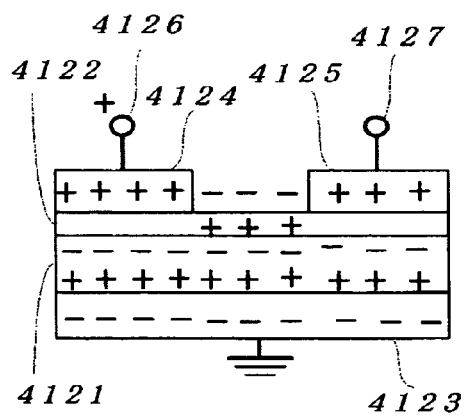
FIGS. 41C and 41D are state diagrams showing an example of polarization of a ferroelectric material in a structure of the polarization transfer device according to the present invention.
Figure 41D:
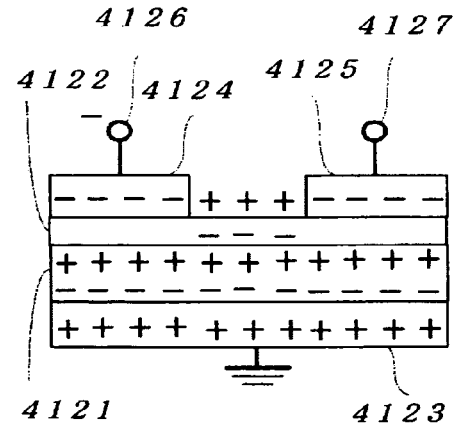

An example is shown in FIGS. 41C and 41D. The structure shown in FIGS. 41C and 41D differs from the structure shown in FIGS. 40A and 40B in that a paraelectric insulating layer 4122 is provided between a ferroelectric thin film 4121 and upper electrodes 4124 and 4125. In this case, a negative potential is applied to the left upper electrode 4124 and right upper electrode 4125 to polarize the ferroelectric thin film directly underneath the upper electrodes 4124 and 4125 with the upper part being positive and the lower part being negative. Then, the upper electrode 4125 and a terminal 4137 are allowed to discharge potential. This state is shown in FIG. 41D.

Next, a positive potential is applied to the left upper electrode 4124 via a terminal 4126. This polarizes the ferroelectric thin film directly underneath the upper electrode 4124 with the upper part being negative and the lower part being positive. That is, the direction of polarization is reversed along with the positive/negative reversal of the applied voltage. At this time, if the state of polarization of the ferroelectric thin film directly underneath the right upper electrode 4135 is checked via the terminal 4127, the polarization may be reversed as shown in FIG. 41C from its original state shown in FIG. 40A. The polarization is observed to change more greatly at least in polarization amount than the original state (shown in FIG. 40A) in which the upper part is positive and the lower part is negative. The state change and its changing amount depend heavily on the material and thickness of the paraelectric insulating layer as well as on the distance between the electrodes 4124 and 4125, etc. Presumably, this is because a state of induced charge is changed by the provision of the paraelectric insulating layer, causing changes to the stable state of the potential in the upper part of the ferroelectric thin film. That is, depending on the structure and potential of the upper part of the ferroelectric thin film, it is suggested that the polarization domain wall of the ferroelectric thin film directly underneath can become unstable, causing the polarization to move in the ferroelectric thin film or disappear.

In this way, it has been found experimentally that the state of polarization of ferroelectric thin film will change with the material and potential of the upper part of the ferroelectric thin film. The present invention makes use of the above phenomenon aggressively and arbitrarily. Embodiments will be described below.

First Embodiment of Device Structure

Figure 1:
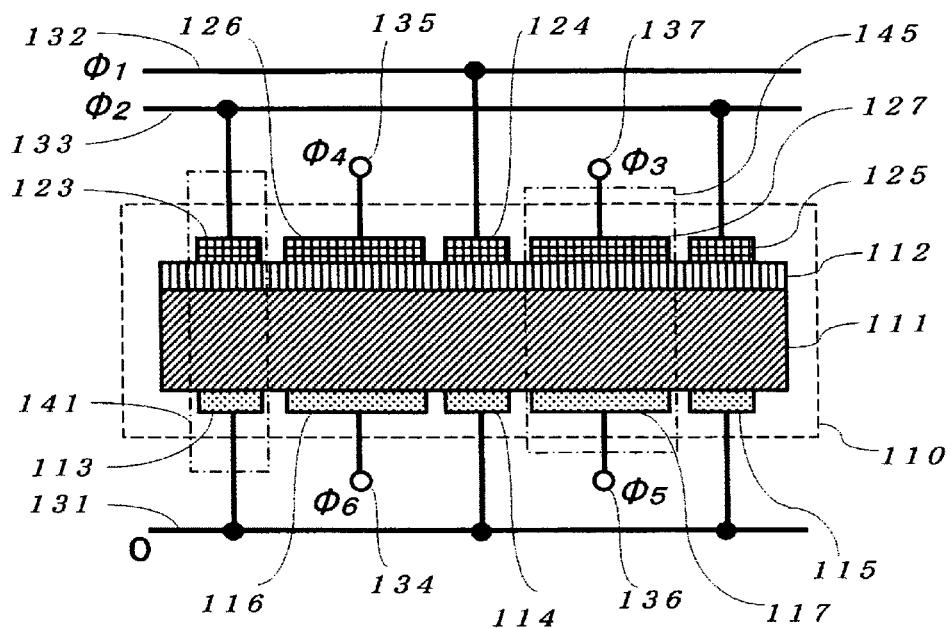
FIG. 1 is a sectional view showing a structure of a polarization transfer device according to a first embodiment of the present invention and at the same time a connection diagram showing a relationship with control signals.

FIG. 1 is a sectional view showing a structure of a polarization transfer device according to a first embodiment of the present invention and at the same time a connection diagram showing a relationship with control signals.

In FIG. 1, the area surrounded by a broken line 110 shows a sectional structure of the polarization transfer device. Reference numeral 111 denotes a ferroelectric thin film made of PZTN; 112 denotes a paraelectric insulating layer made of NiO (nickel oxide); 113, 114, 115, 116, and 117 denote lower electrodes made of Pt (platinum); and 123, 124, 125, 126, and 127 denote upper electrodes made of Pt (platinum). Incidentally, although it is assumed here that the ferroelectric thin film 111 is made of PZTN, it may be made of well-known PZT or SBT, where PZT is a general term for $Pb(Zr, Ti)O_3$, PZTN is a general term for substances obtained by substituting part of Ti in PZT with Nb, and SBT is general term for $SrBi_2Ta_2O_9$ or substances similar in composition. Also, although it has been stated that the upper electrodes are made of Pt (platinum) as an example, they may be made of another metal such as Ta (tantalum) or Ti (titanium) or metal oxide such as $IrO_2$ (iridium oxide) or $RuO_2$ (rubidium oxide) as long as characteristics of the material including reliability are ensured.

The ferroelectric thin film 111 and paraelectric insulating layer 112 sandwiched between the lower electrode (first gate electrode) 113 and upper electrode (second gate electrode) 123 compose a first polarization switch, which is surrounded by a chain line 141 in FIG. 1. Also, the ferroelectric thin film 111 and paraelectric insulating layer 112 sandwiched between the lower electrode 114 and upper electrode 124 compose a second polarization switch while the ferroelectric thin film 111 and paraelectric insulating layer 112 sandwiched between the lower electrode 115 and upper electrode 125 compose a third polarization switch.

On the other hand, the ferroelectric thin film 111 and paraelectric insulating layer 112 sandwiched between the lower electrode 116 and upper electrode 126 compose a first polarization accumulator while the ferroelectric thin film 111 and paraelectric insulating layer 112 sandwiched between the lower electrode 117 and upper electrode 127 compose a second polarization accumulator, which is surrounded by a chain line 145 in FIG. 1.

The respective lower electrodes 113, 114, and 115 of the first polarization switch, second polarization switch, and third polarization switch are connected to ground potential 131. The upper electrode 124 of the second polarization switch is connected to a first control signal line 132 for Φ1. The respective upper electrodes 123 and 125 of the first polarization switch and third polarization switch are connected to a second control signal line 133 for Φ2.

The upper electrode 126 of the first polarization accumulator is connected via a terminal 135 to a fourth control signal line for Φ4. The lower electrode 116 of the first polarization accumulator is connected via a terminal 134 to a sixth control signal line for Φ6. The upper electrode 127 of the second polarization accumulator is connected via a terminal 137 to a third control signal line for Φ3. The lower electrode 117 of the second polarization accumulator is connected via a terminal 136 to a fifth control signal line for Φ5.

With the above configuration, polarization which reflects signals is accumulated and transferred in the ferroelectric thin film, but operation and action vary depending on a combination of signal waveforms of Φ1, Φ2, Φ3, Φ4, Φ5, and Φ6 applied to the control signal lines. Examples of the control method will be shown below.

First Example of Control Signals

Figure 25:
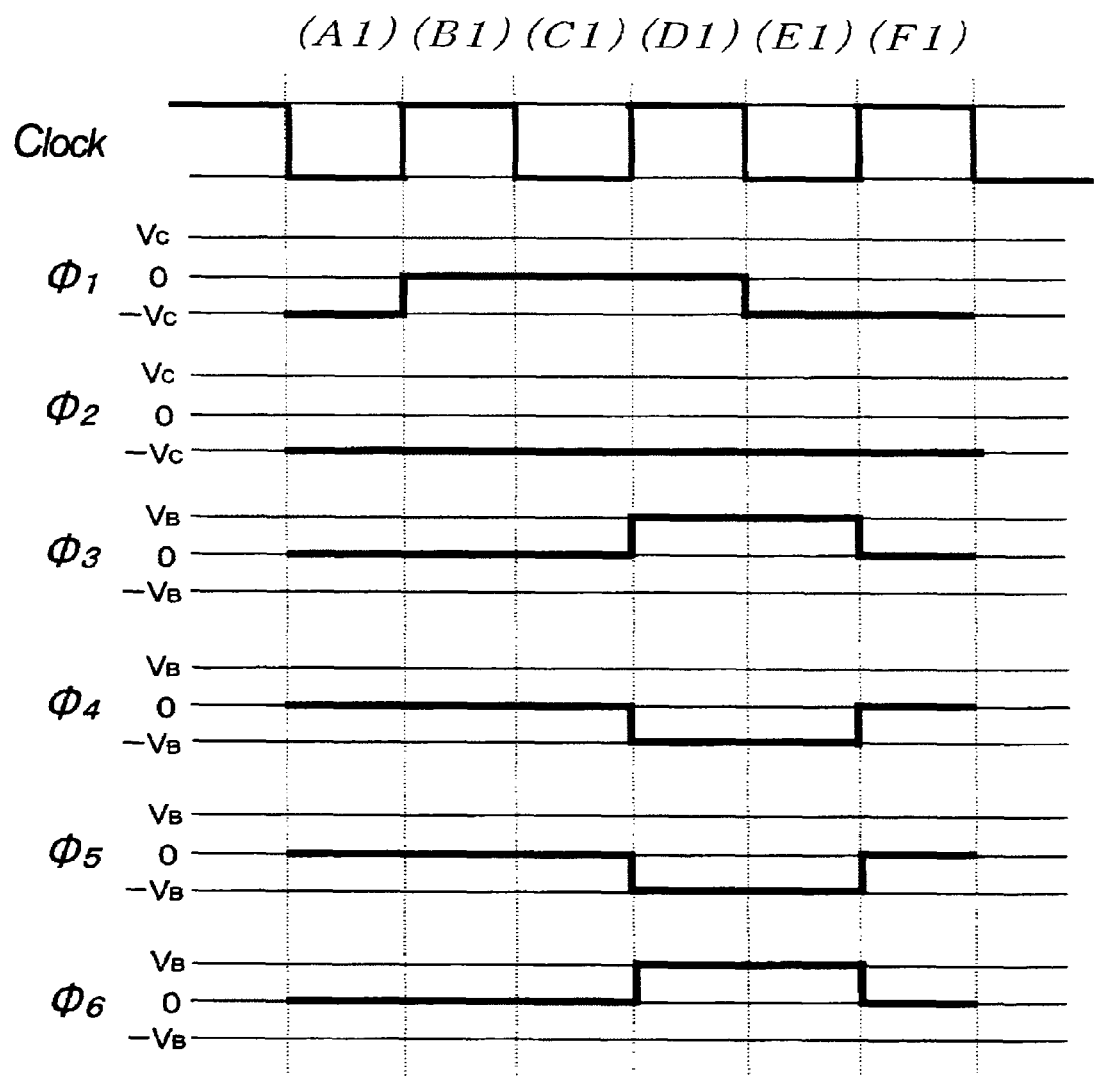
FIG. 25 is a diagram showing signal waveforms of a first example used to control the polarization transfer device according to the present invention.

FIG. 25 is a diagram showing a first example of signal waveforms applied to the polarization transfer device shown in FIG. 1 via the control signal lines. In FIG. 25, Φ1 is applied to the upper electrode 124 of the second polarization switch via the control signal line 132 shown in FIG. 1 while Φ2 is applied to the respective upper electrodes 123 and 125 of the first polarization switch and third polarization switch via the control signal line 133 shown in FIG. 1. Incidentally, the potentials of both Φ1 and Φ2 vary between 0 and $-V_C$.

Also, in FIG. 25, Φ3 is applied to the upper electrode 127 of the second polarization accumulator shown in FIG. 1, Φ4 is applied to the upper electrode 126 of the first polarization accumulator, Φ5 is applied to the lower electrode 117 of the second polarization accumulator, and Φ6 is applied to the lower electrode 116 of the first polarization accumulator. Incidentally, the potentials of all Φ3, Φ4, Φ5, and Φ6 vary among $V_B$, 0, and $-V_B$.

Figure 42:
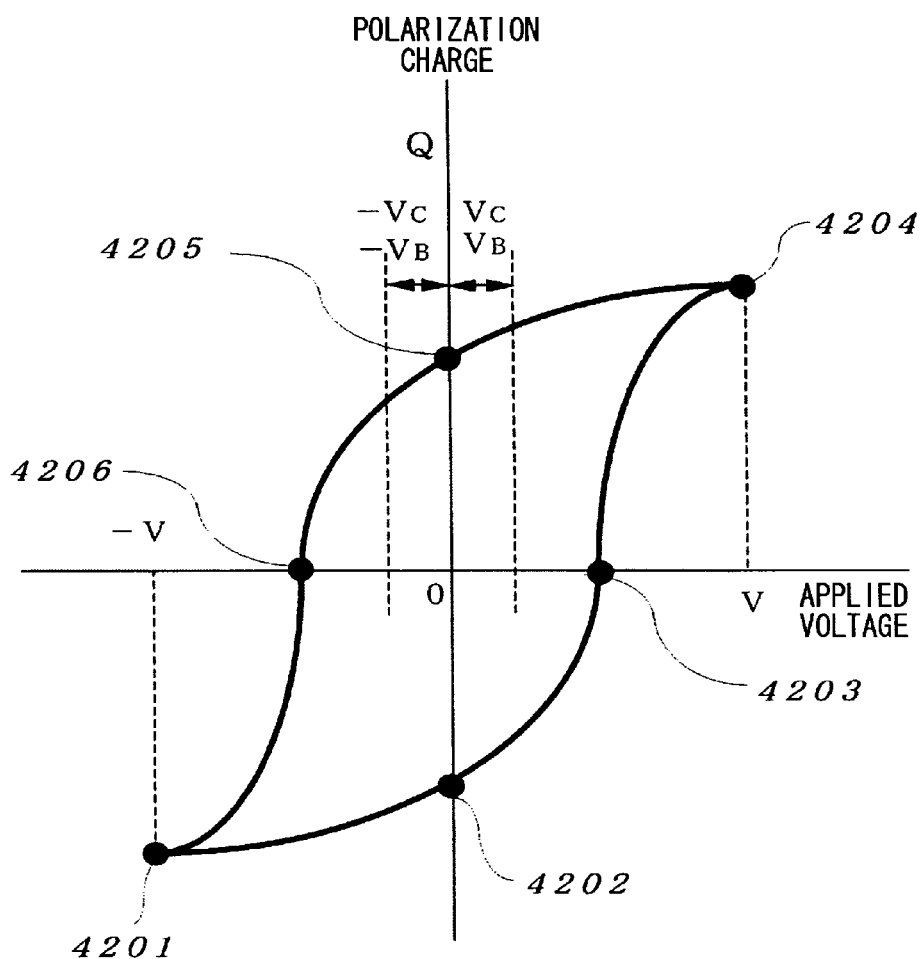
FIG. 42 is a characteristic curve showing a relationship between applied voltage and polarized charge of a ferroelectric capacitor used in the present invention and a conventional example.
Figure 43:
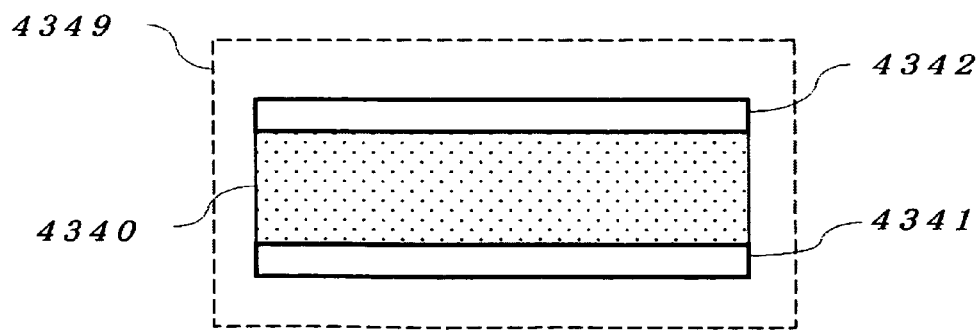
FIG. 43 is a sectional view showing a structure of a ferroelectric capacitor used in the present invention and a conventional example.
Figure 44:
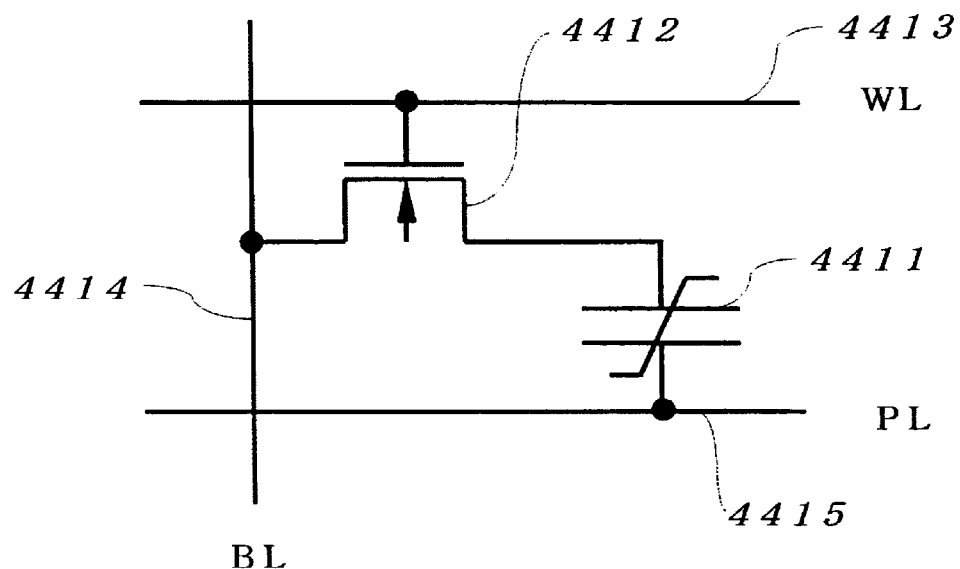
FIG. 44 is a circuit block diagram of a memory cell used for a conventional ferroelectric memory.
Figure 45:
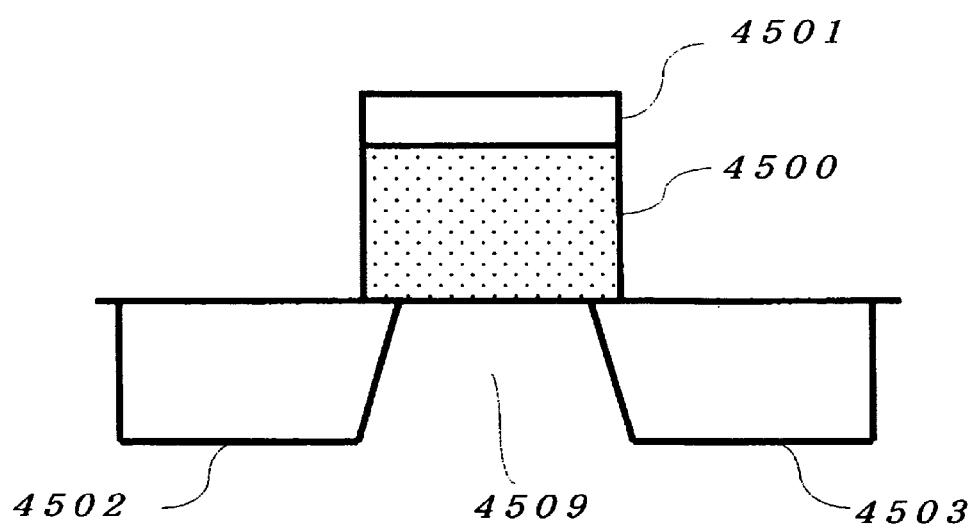
FIG. 45 is a sectional view showing a structure of a field effect transistor used for a conventional ferroelectric memory, with a ferroelectric thin film formed in the gate.
Figure 46:
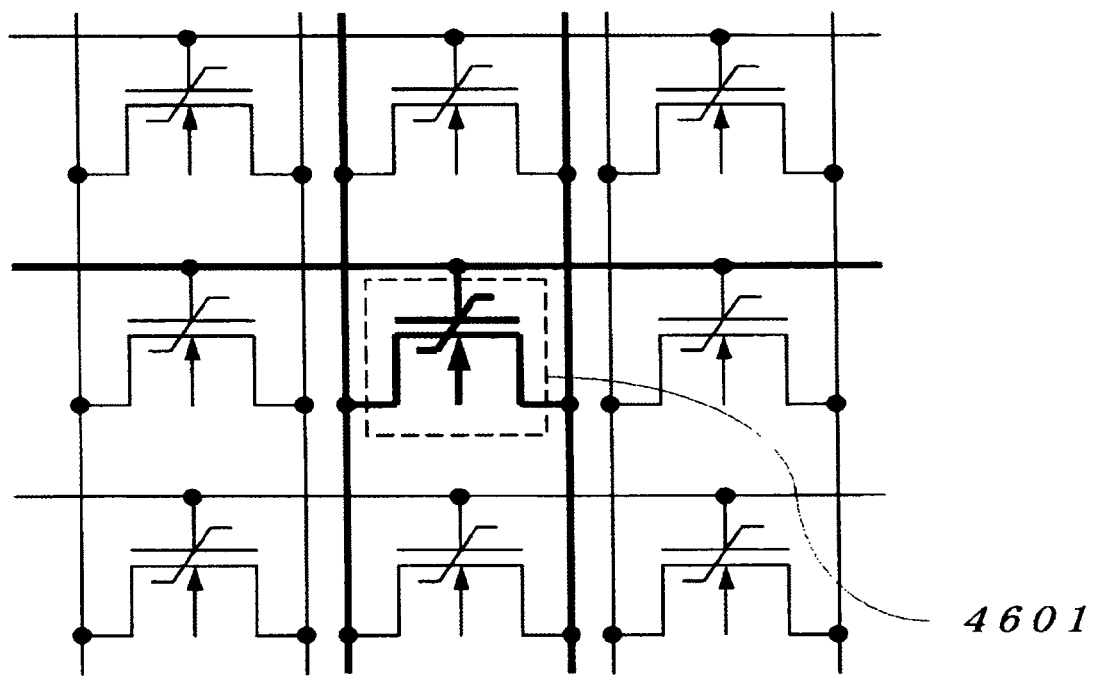
FIG. 46 is a circuit block diagram of a memory cell array in a conventional ferroelectric memory device using field effect transistors with a ferroelectric thin film formed in the gate.

None of $V_C$, $-V_C$, $V_B$, $-V_B$, and $2V_B$ is higher than the coercive voltage of the ferroelectric thin film 111 in FIG. 1. Also, they are set lower than the applied voltage to avoid irreversible impacts on polarized signals to be transferred. Incidentally, the coercive voltage of the ferroelectric thin film is the threshold voltage of positive/negative reversal of polarization charge in FIG. 42.

In FIG. 25, the control signals Φ1, Φ2, Φ3, Φ4, Φ5, and Φ6 are applied in sync with a basic clock. In an (A1) interval, they are set at $-V_C$, $-V_C$, 0, 0, 0, and 0, respectively. In a (B1) interval, they are set at 0, $-V_C$, 0, 0, 0, 0, respectively. In a (C1) interval, they are set at 0, $-V_C$, 0, 0, 0, 0, respectively. In a (D1) interval, they are set at 0, $-V_C$, $V_B$, $-V_B$, $-V_B$, and $V_B$, respectively. In an (E1) interval, they are set at $-V_C$, $-V_C$, $V_B$, $-V_B$, $-V_B$, and $V_B$, respectively. In an (F1) interval, they are set at $-V_C$, $-V_C$, 0, 0, 0, and 0, respectively. The control voltages and states of polarization in the intervals (A1) to (F1) are shown in FIGS. 13A1, 13B1, 13C1, 14D1, 14E1, and 14F1, respectively.

Now, the states of the polarization transfer device when the control signals are applied in the (A1) interval in FIG. 25 will be described with reference to FIG. 13A1.

In FIG. 13A1, a polarized signal is accumulated in the ferroelectric thin film of the first polarization accumulator, resulting in a polarization with the upper part being negative and the lower part being positive. There is no polarization corresponding to the signal in the ferroelectric thin film of the second polarization accumulator. A potential of $-V_C$ is applied to the upper electrodes of the second polarization switch controlled by Φ1 and the first and third polarization switches controlled by Φ2, causing the ferroelectric thin film directly underneath the first to third polarization switches to be polarized with the upper part being positive and the lower part being negative. Thus, the polarized signal of the first polarization accumulator is separated from the second polarization accumulator by a polarization domain wall of reverse polarity provided by the second polarization switch, causing the polarized signal to be accumulated in the first polarization accumulator and stored in isolation.

Next, in the (B1) interval in FIG. 25, the potential of Φ1 is set to 0. Consequently, the polarization domain wall directly underneath the second polarization switch disappears as shown in FIG. 13B1, allowing the polarization corresponding to the signal to move.

Next, in the (C1) interval in FIG. 25, if the control signal is kept in the state in which it was in the (B1) interval, the polarized signal in the first polarization accumulator becomes able to move through the second polarization switch as shown in FIG. 13C1. Consequently, polarization corresponding to the signal comes into existence both in the first polarization accumulator and second polarization accumulator.

Furthermore, in the (D1) interval in FIG. 25, a potential of $V_B$ is applied to Φ3 and Φ6 while $-V_B$ is applied to Φ4 and Φ5. Consequently, as shown in FIG. 14D1, the upper electrode of the second polarization accumulator changes to $V_B$, attracting the negative charge of signal polarization in the upper part of the ferroelectric thin film while the lower electrode of the second polarization accumulator changes to $-V_B$, attracting the positive charge of the signal polarization in the lower part of the ferroelectric thin film. On the other hand, the upper electrode of the first polarization accumulator changes to $-V_B$, repelling the negative charge of the signal polarization in the upper part of the ferroelectric thin film while the lower electrode of the first polarization accumulator changes to $V_B$, repelling the positive charge of the signal polarization in the lower part of the ferroelectric thin film. Consequently, the signal polarization with the upper part of the ferroelectric thin film negatively charged and the lower part of the ferroelectric thin film positively charged moves from the first polarization accumulator to the second polarization accumulator.

Next, in the (E1) interval in FIG. 25, a potential of $-V_C$ is applied to Φ1. Consequently, as shown in FIG. 14E1, the upper electrode of the second polarization accumulator changes to $-V_C$, causing the movement of the signal polarization through the second polarization switch to stop.

Next, in the (F1) interval in FIG. 25, the potentials of Φ3, Φ4, Φ5, and Φ6 are all returned to 0. The potentials of Φ1 and Φ2 remain at $-V_C$. Consequently, as shown in FIG. 14F1, the signal polarization is accumulated in the second polarization accumulator. A little polarization component equivalent to a bias caused when a voltage of $V_B$ or $-V_B$ is applied remains in the first polarization accumulator. Incidentally, these polarizations are residual because a 0 voltage is applied to the upper and lower electrodes of the first and second polarization accumulators. Since a potential of $-V_C$ is applied to the upper electrodes of the first, second, and third polarization switches, the first and second polarization accumulators are separated by the first, second, and third polarization switches.

When FIGS. 14F1 and 13A1 are compared, signal polarization which reflects the signal is moving from the first polarization accumulator to the second polarization accumulator. Thus, it can be seen that in the polarization transfer device shown in FIG. 1, when the control signals Φ1, Φ2, Φ3, Φ4, Φ5, and Φ6 shown in FIG. 25 are applied to respective terminals, the signal polarization moves from the first polarization accumulator to the second polarization accumulator, that is, from left to right.

Second Example of Control Signals

Figure 28:
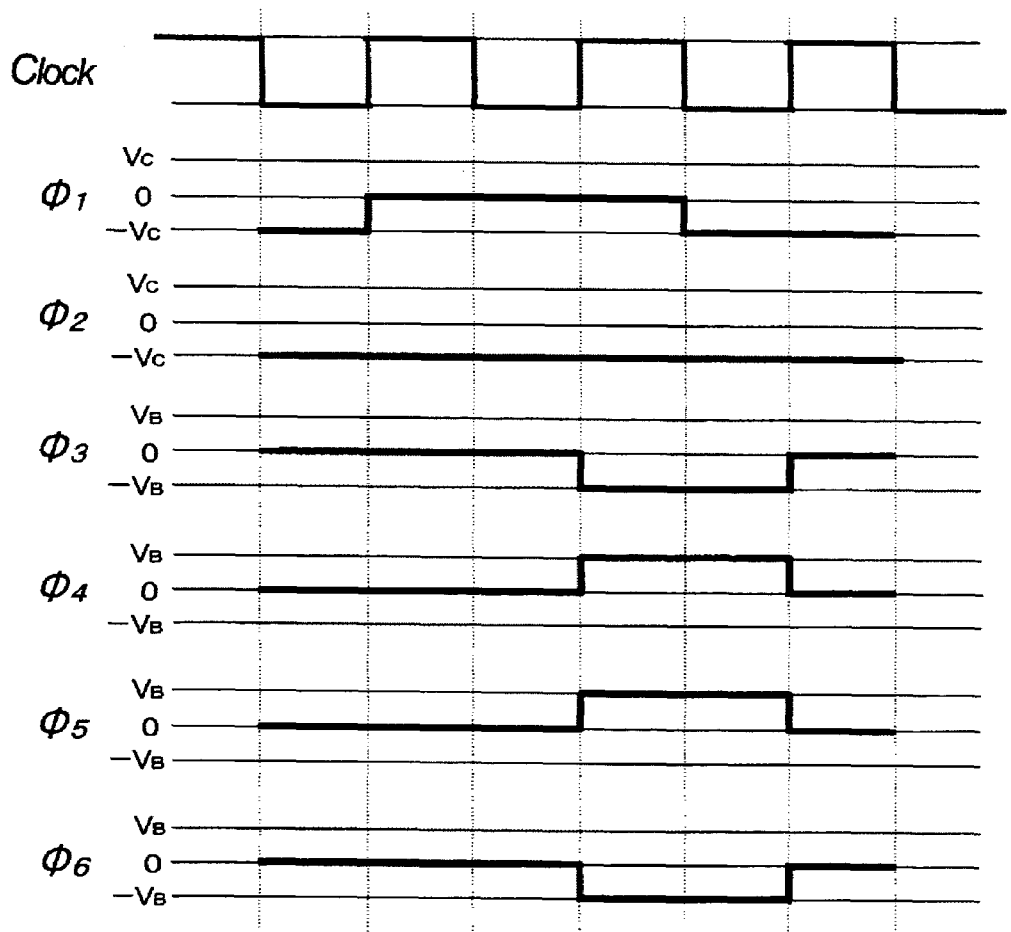
FIG. 28 is a diagram showing signal waveforms of a second example used to control the polarization transfer device according to the present invention.

FIG. 28 is a diagram showing a second example of signal waveforms applied to the polarization transfer device shown in FIG. 1 via the control signal lines.

In FIG. 28, the control signals Φ1, Φ2, Φ3, Φ4, Φ5, and Φ6 are applied in sync with a basic clock. In a (G1) interval, they are set at $-V_C$, $-V_C$, 0, 0, 0, and 0, respectively. In an (H1) interval, they are set at 0, $-V_C$, 0, 0, 0, 0, respectively. In an (I1) interval, they are set at 0, $-V_C$, 0, 0, 0, 0, respectively. In a (J1) interval, they are set at 0, $-V_C$, $-V_B$, $V_B$, $V_B$, and $-V_B$, respectively. In a (K1) interval, they are set at $-V_C$, $-V_C$, $-V_B$, $V_B$, $V_B$, and $-V_B$, respectively. In an (L1) interval, they are set at $-V_C$, $-V_C$, 0, 0, 0, and 0, respectively.

The control voltages and states of polarization in the intervals (G1) to (L1) are shown in FIGS. 15G1, 15H1, 15I1, 16J1, 16K1, and 16L1, respectively.

Now, the states of the polarization transfer device when the control signals are applied in the (G1) interval in FIG. 28 will be described with reference to FIG. 15G1.

In FIG. 15G1, a polarized signal is accumulated in the ferroelectric thin film of the second polarization accumulator, resulting in a polarization with the upper part being negative and the lower part being positive. There is no polarization corresponding to the signal in the ferroelectric thin film of the first polarization accumulator. A potential of $-V_C$ is applied to the upper electrodes of the second polarization switch controlled by Φ1 and the first and third polarization switches controlled by Φ2, causing the ferroelectric thin film directly underneath the first to third polarization switches to be polarized with the upper part being positive and the lower part being negative. Thus, the polarized signal of the second polarization accumulator is separated from the first polarization accumulator by a polarization domain wall of reverse polarity provided by the second polarization switch, causing the polarized signal to be accumulated in the second polarization accumulator and stored in isolation.

Next, in the (H1) interval in FIG. 28, the potential of Φ1 is set to 0. Consequently, the polarization domain wall directly underneath the second polarization switch disappears as shown in FIG. 15H1, allowing the polarization corresponding to the signal to move.

Next, in the (I1) interval in FIG. 28, if the control signal is kept in the state in which it was in the (H1) interval, the polarized signal in the second polarization accumulator becomes able to move through the second polarization switch as shown in FIG. 15I1. Consequently, polarization corresponding to the signal comes into existence both in the first polarization accumulator and second polarization accumulator.

Furthermore, in the (J1) interval in FIG. 28, a potential of $-V_B$ is applied to Φ3 and Φ6 while $V_B$ is applied to Φ4 and Φ5. Consequently, as shown in FIG. 16J1, the upper electrode of the first polarization accumulator changes to $V_B$, attracting the negative charge of signal polarization in the upper part of the ferroelectric thin film while the lower electrode of the first polarization accumulator changes to $-V_B$, attracting the positive charge of the signal polarization in the lower part of the ferroelectric thin film. On the other hand, the upper electrode of the second polarization accumulator changes to $-V_B$, repelling the negative charge of the signal polarization in the upper part of the ferroelectric thin film while the lower electrode of the second polarization accumulator changes to $V_B$, repelling the positive charge of the signal polarization in the lower part of the ferroelectric thin film. Consequently, the signal polarization with the upper part of the ferroelectric thin film negatively charged and the lower part of the ferroelectric thin film positively charged moves from the second polarization accumulator to the first polarization accumulator.

Next, in the (K1) interval in FIG. 28, a potential of $-V_C$ is applied to Φ1. Consequently, as shown in FIG. 16K1, the upper electrode of the second polarization switch changes to $-V_C$, causing the movement of the signal polarization through the second polarization switch to stop.

Next, in the (L1) interval in FIG. 28, the potentials of Φ3, Φ4, Φ5, and Φ6 are all returned to 0. The potentials of Φ1 and Φ2 remain at $-V_C$. Consequently, as shown in FIG. 16L1, the signal polarization is accumulated in the first polarization accumulator. A little polarization component equivalent to a bias caused when a voltage of $V_B$ or $-V_B$ is applied remains in the second polarization accumulator. Incidentally, these polarizations are residual because a 0 voltage is applied to the upper and lower electrodes of the first and second polarization accumulators. Since a potential of $-V_C$ is applied to the upper electrodes of the first, second, and third polarization switches, the first and second polarization accumulators are separated by the first, second, and third polarization switches.

When FIGS. 16L1 and 15G1 are compared, signal polarization which reflects the signal is moving from the second polarization accumulator to the first polarization accumulator. Thus, it can be seen that in the polarization transfer device shown in FIG. 1, when the control signals Φ1, Φ2, Φ3, Φ4, Φ5, and Φ6 shown in FIG. 28 are applied to respective terminals, the signal polarization moves from the second polarization accumulator to the first polarization accumulator, that is, from right to left.

Incidentally, when the first example of the control signals in FIG. 25 and second example of the control signals in FIG. 28 are compared, the first example of the control signals is a combination of control signal waveforms which moves signal polarization from left to right and the second example of the control signals is a combination of control signal waveforms which moves signal polarization from right to left. The waveform charts in FIGS. 25 and 28 differ from each other in intervals (D1) to (E1) and intervals (J1) to (K1) of Φ3, Φ4, Φ5, and Φ6. In particular, signal polarization moves most actively in the intervals (D1) and (J1). So in FIG. 14D1 which corresponds to the (D1) interval in FIG. 25, voltages are applied to the upper and lower electrodes of the first and second polarization accumulators so as to form such electric fields between the upper electrodes as well as between the lower electrodes that will move the signal polarization from the first polarization accumulator to the second polarization accumulator.

On the other hand, in FIG. 16J1 which corresponds to the (J1) interval in FIG. 28, voltages are applied to the upper and lower electrodes of the second and first polarization accumulators so as to form such electric fields between the upper electrodes as well as between the lower electrodes that will move the signal polarization from the second polarization accumulator to the first polarization accumulator.

Thus, it can be seen that in the intervals in which the signal polarization moves most actively, the signal polarization can be moved either leftward or rightward depending on how electric fields are formed by the application of voltages to the upper and lower electrodes of the first and second polarization accumulators.

Third Example of Control Signals

Figure 31:
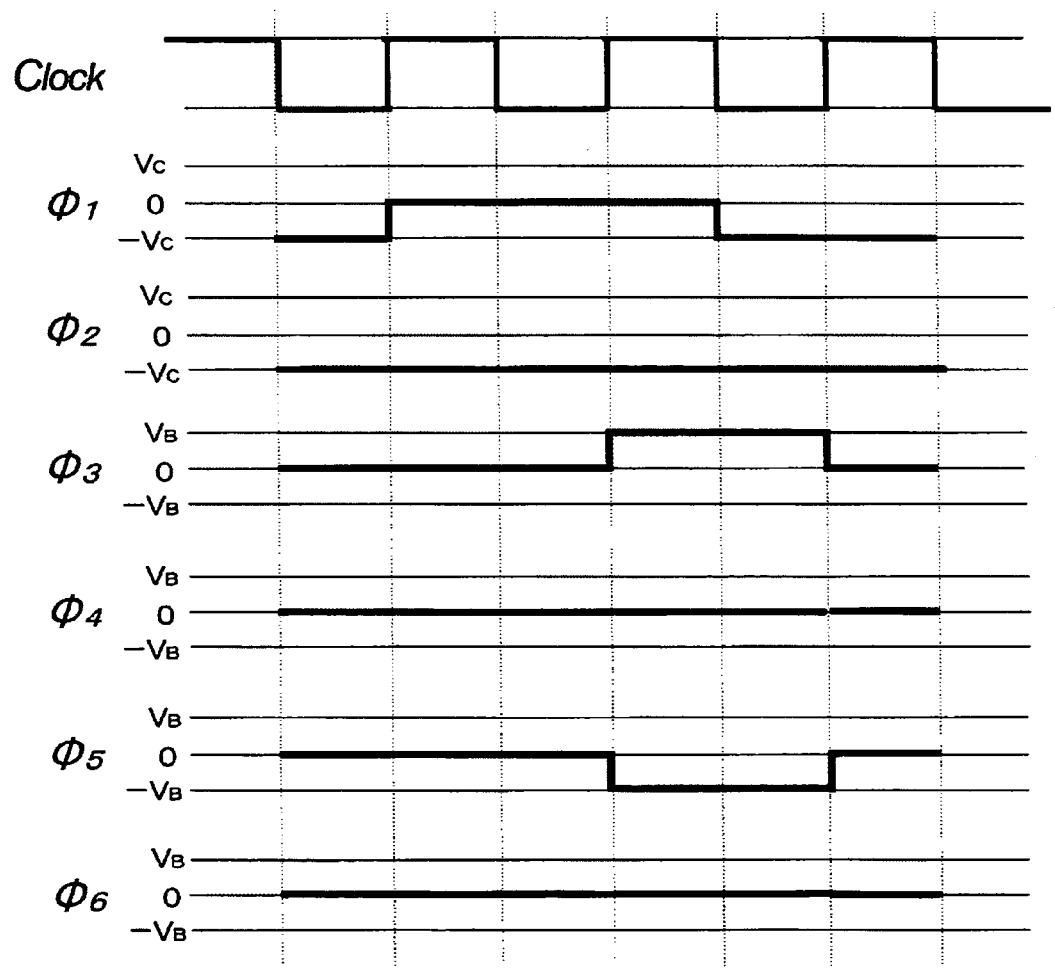
FIG. 31 is a diagram showing signal waveforms of a third example used to control the polarization transfer device according to the present invention.

FIG. 31 is a diagram showing a third example of signal waveforms applied to the polarization transfer device shown in FIG. 1 via the control signal lines.

Signal waveforms of Φ1, Φ2, Φ3, Φ4, Φ5, and Φ6 are shown in intervals (A3), (B3), (C3), (D3), (E3), and (F3) in FIG. 31 and states of the polarization transfer device in FIG. 1 in the intervals (A3) to (F3) are shown in FIGS. 21A3, 21B3, 21C3, 22D3, 22E3, and 22F3, respectively.

Figure 3:
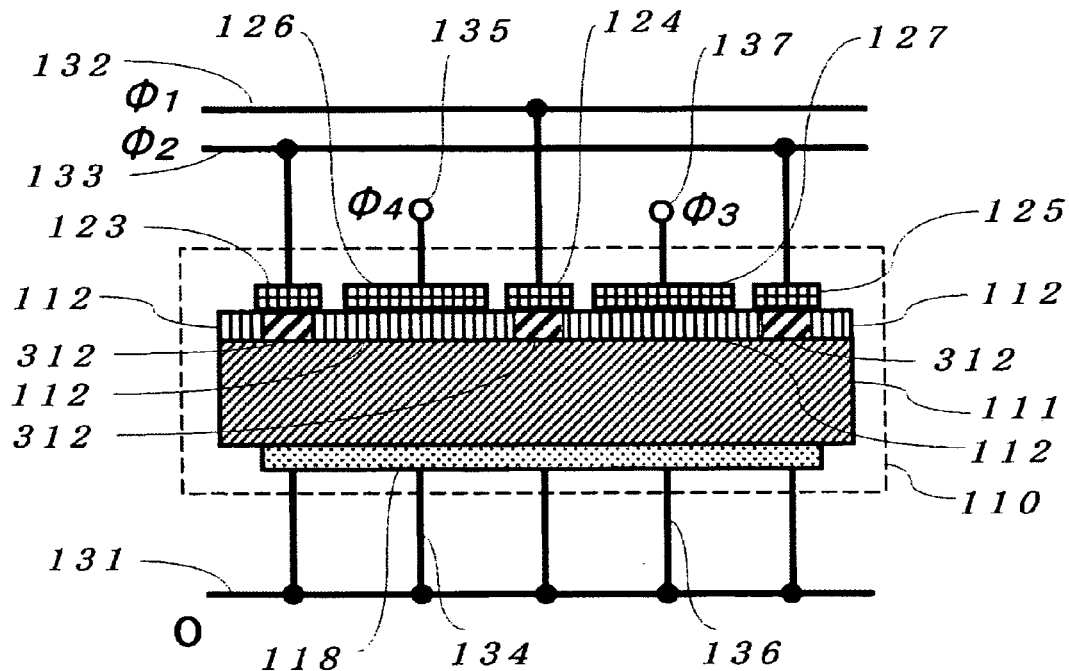
FIG. 3 is a sectional view showing a structure of a polarization transfer device according to a fifth embodiment of the present invention and at the same time a connection diagram showing a relationship with control signals.

FIG. 31 differs from FIG. 25 (the first example of control signals) in Φ4 and Φ6. Whereas the potentials of Φ4 and Φ6 change to $-V_B$ and $V_B$ respectively in the intervals (D1) and (E1) in FIG. 25, the potentials remain at 0 in the corresponding intervals (D3) and (E3) in FIG. 31. This state has significance especially in FIG. 22D3. Even if the potentials of both Φ4 and Φ6 in FIG. 22D3 are 0, since the potential of Φ3 is $V_B$ and the potential of Φ5 is $-V_B$, there is a force or electric field which attracts signal polarization from the first polarization accumulator to the second polarization accumulator, moving the signal polarization from left to right. Although the force which moves the signal polarization is weaker, if that is all right, it is sometimes useful to select the control signal waveforms of FIG. 31 to reduce power consumption.

Fourth Example of Control Signals

Figure 32:
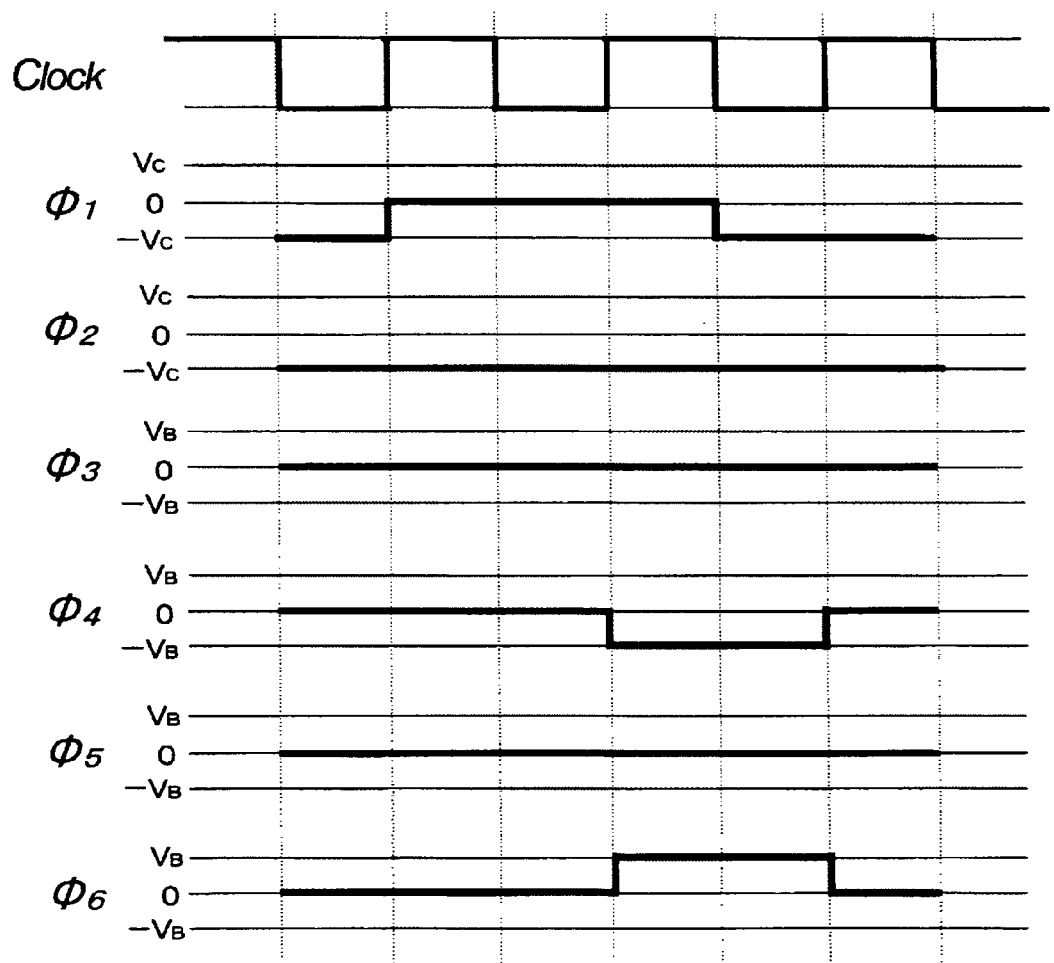
FIG. 32 is a diagram showing signal waveforms of a fourth example used to control the polarization transfer device according to the present invention.

FIG. 32 is a diagram showing a fourth example of signal waveforms applied to the polarization transfer device shown in FIG. 1 via the control signal lines.

Signal waveforms of Φ1, Φ2, Φ3, Φ4, Φ5, and Φ6 are shown in intervals (A4), (B4), (C4), (D4), (E4), and (F4) in FIG. 32 and states of the polarization transfer device in FIG. 1 in the intervals (A4) to (F4) are shown in FIGS. 23A4, 23B4, 23C4, 24D4, 24E4, and 24F4, respectively.

Figure 4:
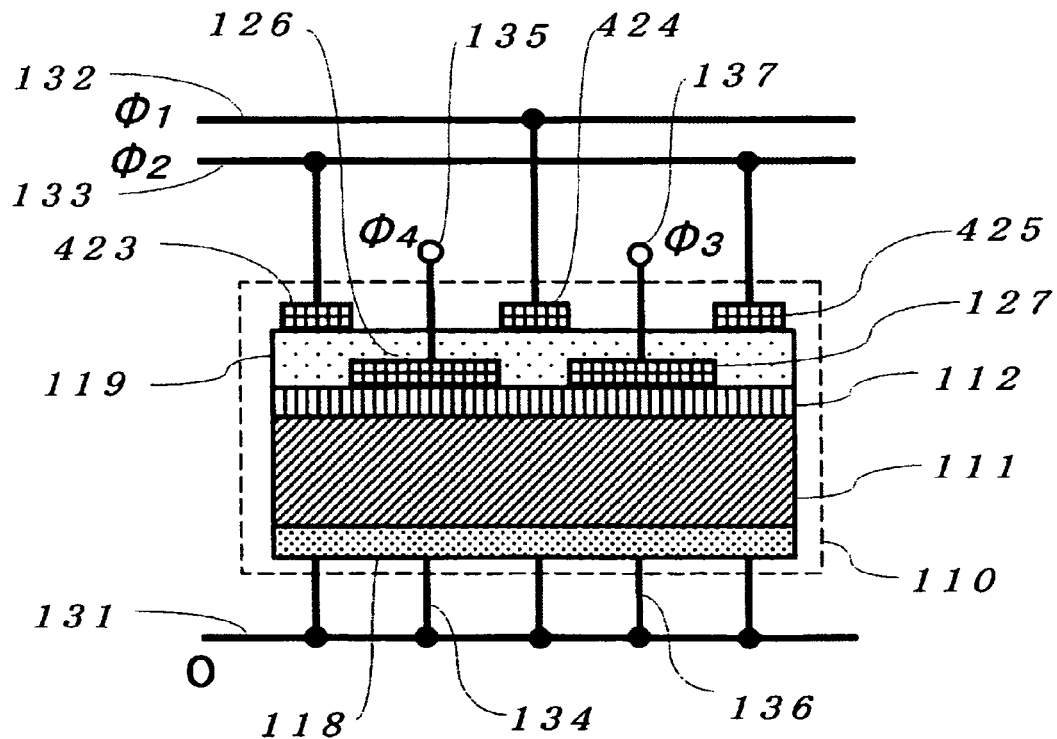
FIG. 4 is a sectional view showing a structure of a polarization transfer device according to an eighth embodiment of the present invention and at the same time a connection diagram showing a relationship with control signals.

FIG. 32 differs from FIG. 25 (the first example of control signals) in Φ3 and Φ5. Whereas the potentials of Φ3 and Φ5 change to $V_B$ and $-V_B$ respectively in the intervals (D1) and (E1) in FIG. 25, the potentials remain at 0 in the corresponding intervals (D4) and (E4) in FIG. 32. This state has significance especially in FIG. 24D4. Even if the potentials of both Φ3 and Φ5 in FIG. 24D4 are 0, since the potential of Φ4 is $-V_B$ and the potential of Φ6 is $V_B$, there is a repellent force or electric field which pushes out signal polarization from the first polarization accumulator to the second polarization accumulator, moving the signal polarization from left to right. Although the force which moves the signal polarization is weaker, if that is all right, it is sometimes useful to select the control signal waveforms of FIG. 32 to reduce power consumption.

Second Embodiment of Device Structure

Figure 6:
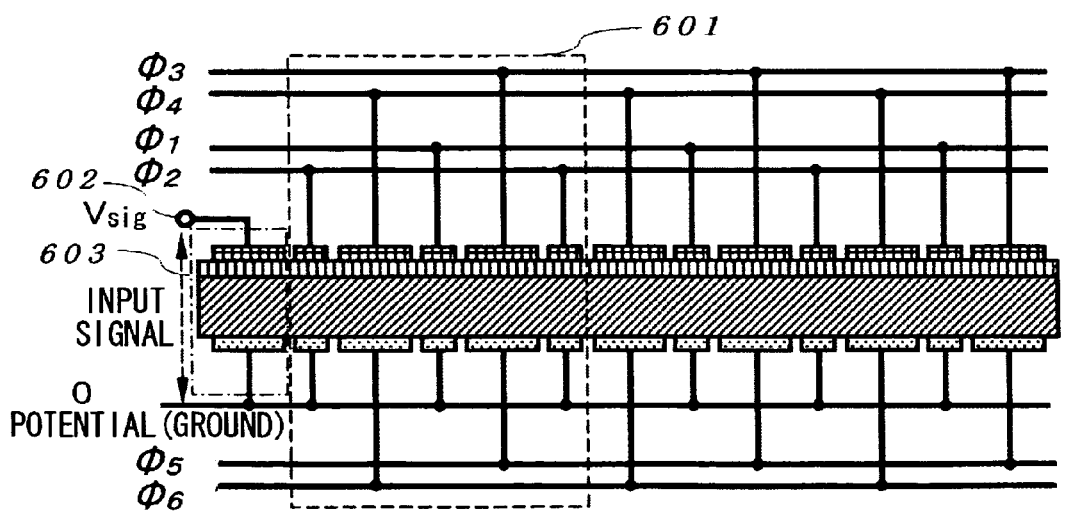
FIG. 6 is a sectional view showing a structure of a polarization transfer device according to a second embodiment of the present invention and at the same time a connection diagram showing a relationship with control signals.

FIG. 6 is a sectional view showing a structure of a polarization transfer device according to a second embodiment of the present invention and at the same time a connection diagram showing a relationship with control signals.

The polarization transfer device in FIG. 6 is basically a connected series of a plurality of the device structures according to the first embodiment in FIG. 1. In FIG. 6, the area surrounded by a broken line 601 shows a constitutional unit which corresponds to the polarization transfer device in FIG. 1. However, the first and third polarization switches in FIG. 1 can be shared when connected as shown in FIG. 6, which allows adjacent switches to be shared, and thus the first and third polarization switches in FIG. 6 are shown as being shared. In FIG. 6, reference numeral 602 denotes an input terminal which accepts an input signal as a voltage. The polarization transfer device in FIG. 6 uses non-volatile polarization of a ferroelectric thin film as a signal, but its input section handles signals in terms of voltage. When a positive voltage is applied to the input terminal 602, polarization corresponding to the input voltage occurs in a polarization input section 603. Subsequently, the polarization is transmitted successively through the linked structure of the polarization transfer device.

Figure 12:
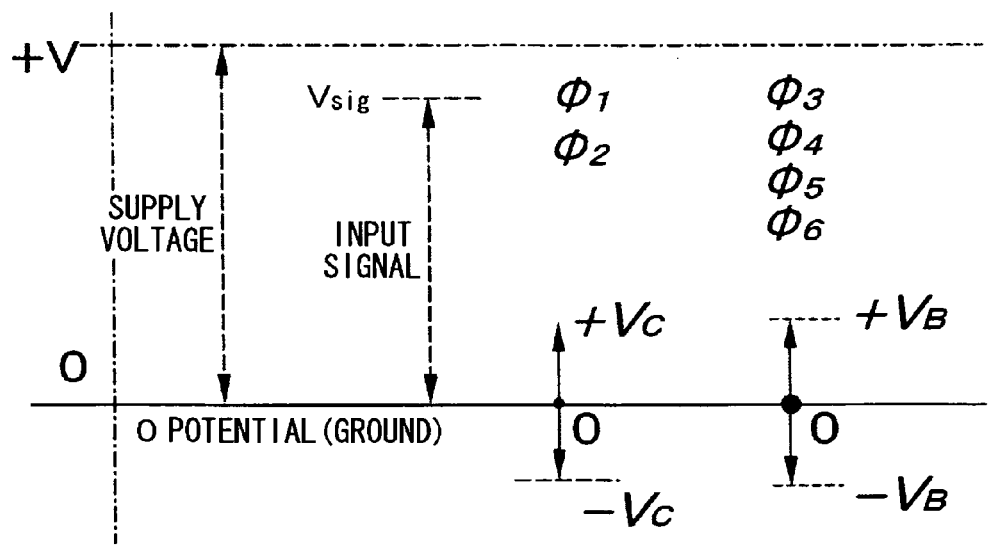
FIG. 12 is a diagram showing a relationship among potentials of signals for use to control the polarization transfer device according to the present invention.

Incidentally, FIG. 12 is a diagram showing a relationship among a supply voltage V; an input signal $V_{sig}$ resulting from the voltage; control potentials 0 and $-V_C$ of the control signals Φ1 and Φ2; and control potentials $V_B$, 0, and $-V_B$ of the control signals Φ3, Φ4, Φ5, and Φ6.

Although in FIG. 1, the control voltages of the polarization switches are 0 and $-V_B$ potentials, positive potentials such as $+V_C$ in FIG. 12 may be used if required in order to obtain desired characteristics.

In FIG. 12, the input signal $V_{sig}$ is not higher than the supply voltage V in principle. Also, the potentials $V_B$, $-V_B$, $-V_C$, and $V_C$ are lower than the coercive voltage of the ferroelectric thin film and do not exceed the input signal $V_{sig}$.

Fifth Example of Control Signals

Figure 33:
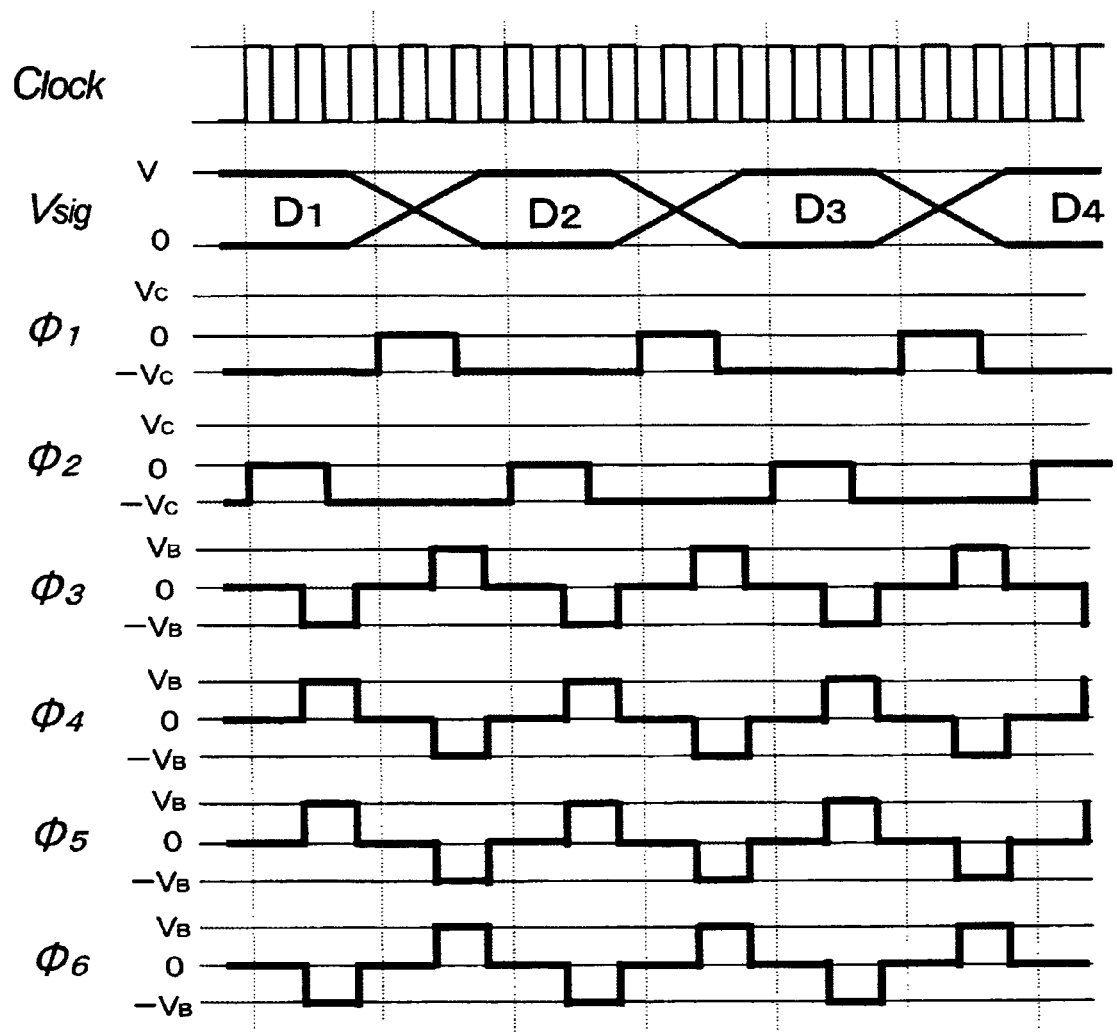
FIG. 33 is a diagram showing signal waveforms of a fifth example used to control the polarization transfer device according to the present invention.

FIG. 33 is a diagram showing a fifth example of signal waveforms applied to the polarization transfer device shown in FIG. 6 via the control signal lines.

As described above, the polarization transfer device in FIG. 6 is a form-connected series of a plurality of the device structures according to the first embodiment in FIG. 1. Also, each control signal Φ1, Φ2, Φ3, Φ4, Φ5, or Φ6 in FIG. 33 is a two-connected series of the respective control signal waveforms in FIG. 25.

Incidentally, although in FIG. 25, the potentials of Φ3 and Φ6 are 0 and $V_B$ while the potentials of Φ4 and Φ5 are 0 and $-V_B$; the potentials of Φ3, Φ4, Φ5, and Φ6 in FIG. 33 vary among $-V_B$, 0, and $V_B$. This is because whereas FIG. 25 shows control signal waveforms produced in FIG. 1 only during movement from the first polarization accumulator to the second polarization accumulator; with the configuration consisting of a further connected series of the basic structures of the polarization transfer device shown in FIG. 1, that is, a relation is established that Φ3, Φ4, Φ5, and Φ6 change places during transfer from the second polarization accumulator to the third polarization accumulator on the adjacent right. Since the control signal waveform chart in FIG. 33 is a connected series of the control signal waveform charts in FIG. 25 as described above, when the polarization transfer device shown in FIG. 6 is controlled using the control signal waveforms in FIG. 33, signal polarization is transmitted successively rightward. Incidentally, timing of application of the input signal in FIG. 6 is also shown in FIG. 33. In FIG. 33, if the input signal $V_{sig}$ is established at a timing other than those which correspond to slant lines of D1, D2, D3, and the like, it can be entered normally.

Sixth Example of Control Signals

Figure 34:
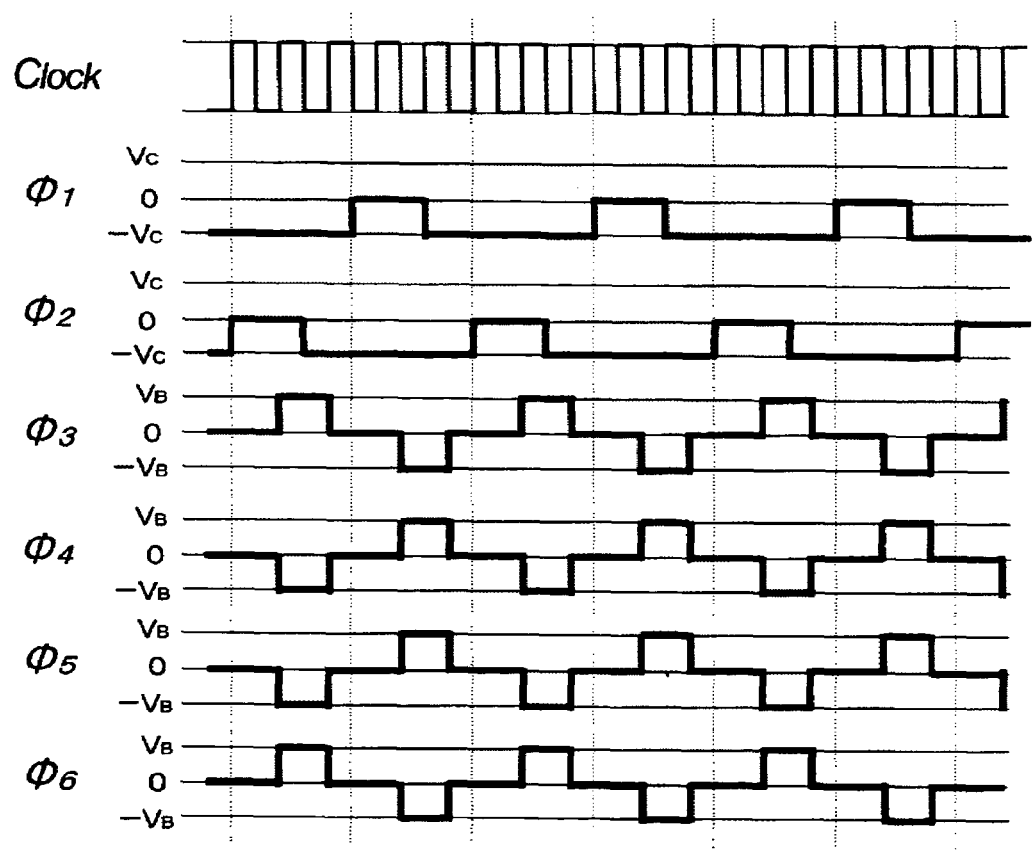
FIG. 34 is a diagram showing signal waveforms of a sixth example used to control the polarization transfer device according to the present invention.

FIG. 34 is a diagram showing a sixth example of signal waveforms applied to the polarization transfer device shown in FIG. 6 via the control signal lines.

As described above, the polarization transfer device in FIG. 6 is a form-connected series of a plurality of the device structures according to the first embodiment in FIG. 1. Also, each control signal Φ1, Φ2, Φ3, Φ4, Φ5, or Φ6 in FIG. 34 is a time-connected series of the respective control signal waveforms in FIG. 26. Thus, it can be seen that the control signal waveforms in FIG. 34 cause signal polarization to be transferred from right to left on the polarization transfer device in FIG. 6.

Figure 26:
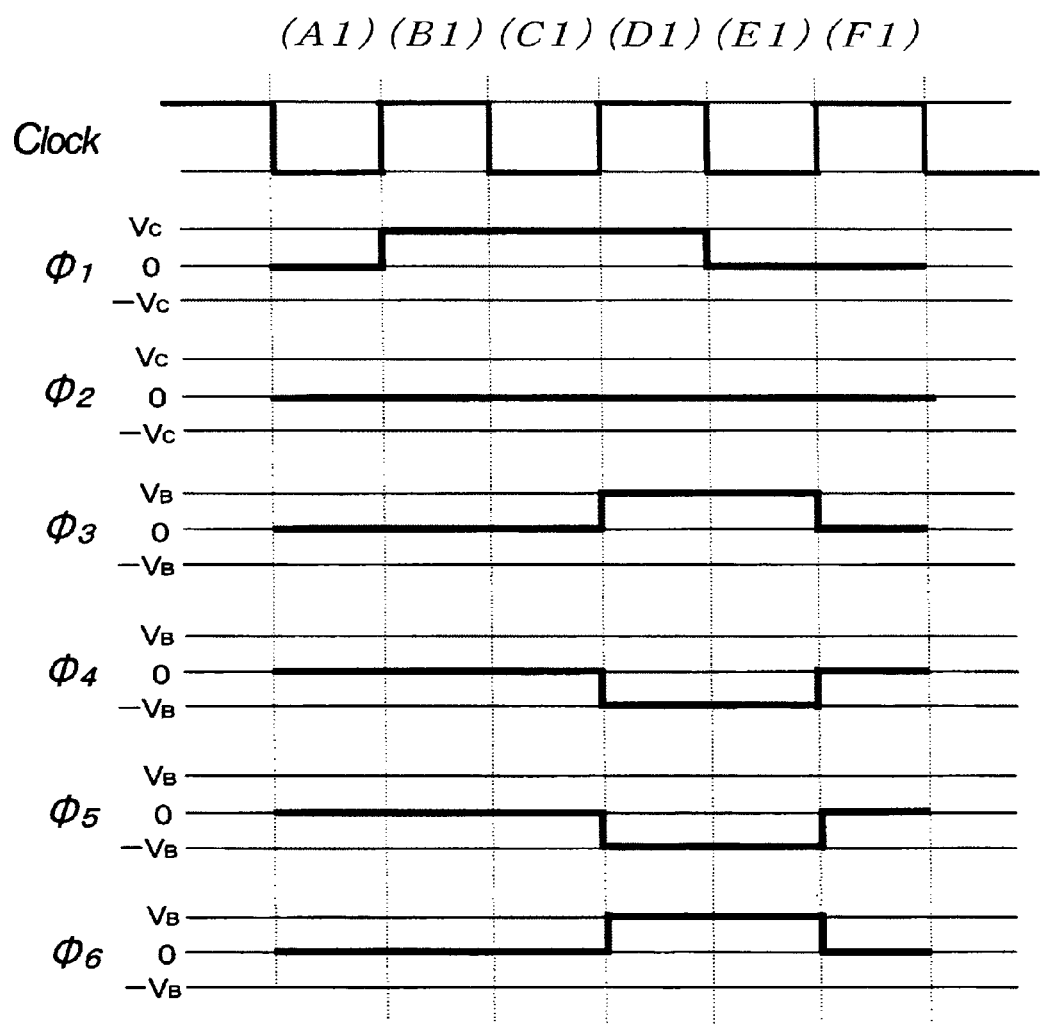
FIG. 26 is a diagram showing signal waveforms of a ninth example used to control the polarization transfer device according to the present invention.

Incidentally, although in FIG. 26, the potentials of Φ3 and Φ6 are 0 and $-V_B$ while the potentials of Φ4 and Φ5 are 0 and $V_B$, the potentials of Φ3, Φ4, Φ5, and Φ6 in FIG. 34 vary among $-V_B$, 0, and $V_B$. The reason is almost the same as the one for the connected series of the basic structures of the polarization transfer device according to the fifth example of control signals. Besides, the input signal $V_{sig}$ shown in FIG. 33 is not shown in FIG. 34. This is because it is assumed that no signal is entered via the input terminal 602 during transfer in reverse from right to left on the polarization transfer device in FIG. 6.

Third Embodiment of Device Structure

Figure 2:
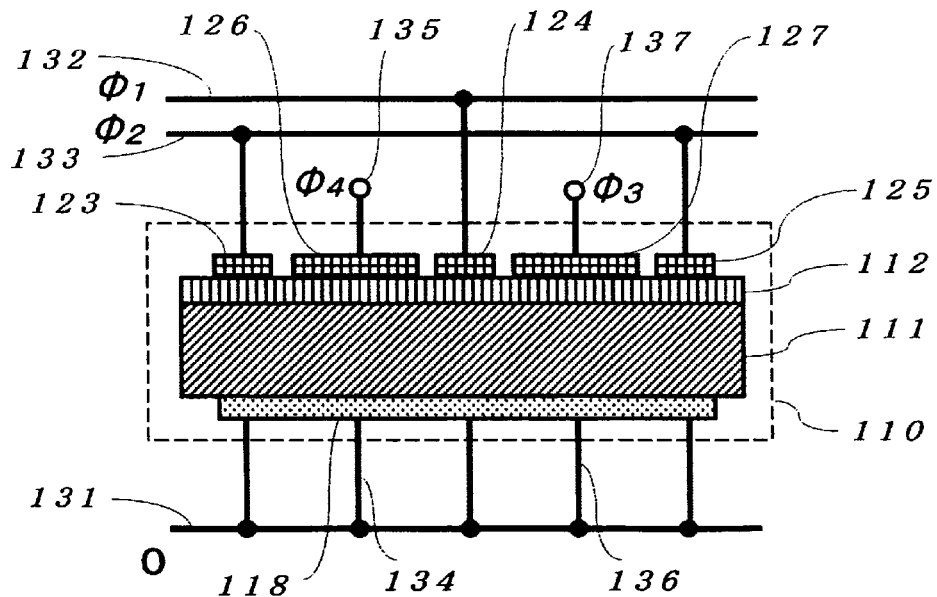
FIG. 2 is a sectional view showing a structure of a polarization transfer device according to a third embodiment of the present invention and at the same time a connection diagram showing a relationship with control signals.

FIG. 2 is a sectional view showing a structure of a polarization transfer device according to a third embodiment of the present invention and at the same time a connection diagram showing a relationship with control signals.

Basically, the device structure in FIG. 2 is an adapted version of the device structure according to the first embodiment in FIG. 1. FIG. 2 differs from FIG. 1 in that the respective lower electrodes 113, 114, and 115 of the first, second, and third polarization switches as well as the respective lower electrodes 116 and 117 of the first and second polarization accumulators in FIG. 1 are replaced by a common electrode 118. The rest of the structure is the same as in FIG. 1. With the structure in FIG. 2, since the common electrode 118 is wide and made of platinum (Pt), the ferroelectric thin film 111 placed on it and made of PZTN has an affinity with the crystal axis of the platinum of the lower electrode. This facilitates crystal growth, resulting in highly reliable ferroelectric crystals with excellent electrical characteristics, and thus makes the polarization transfer device a more reliable product with a higher production stability than the first embodiment in FIG. 1.

Seventh Example of Control Signals

Figure 29:
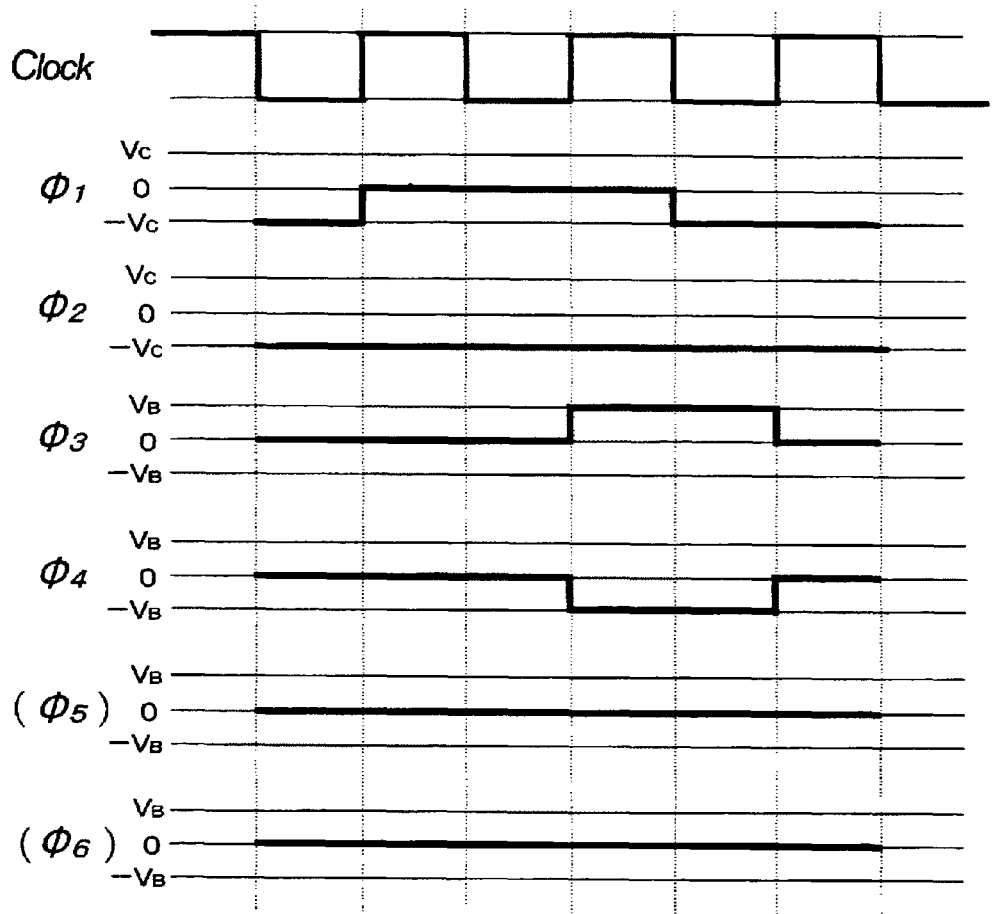
FIG. 29 is a diagram showing signal waveforms of a seventh example used to control the polarization transfer device according to the present invention.

FIG. 29 is a diagram showing a seventh example of signal waveforms applied to the polarization transfer device shown in FIG. 2 via the control signal lines.

Signal waveforms of Φ1, Φ2, Φ3, Φ4, Φ5, and Φ6 are shown in intervals (A2), (B2), (C2), (D2), (E2), and (F2) in FIG. 29 and states of the polarization transfer device in FIG. 2 in the intervals (A2) to (F2) are shown in FIGS. 17A2, 17B2, 17C2, 18D2, 18E2, and 18F2, respectively.

FIG. 29 differs from FIG. 25 (the first example of control signals) in Φ5 and Φ6. Specifically, the respective lower electrodes 113, 114, and 115 of the first, second, and third polarization switches as well as the respective lower electrodes 116 and 117 of the first and second polarization accumulators in FIG. 1 are replaced in FIG. 2 by the common electrode 118, which is fixed at the ground potential of 0. Consequently, Φ5 and Φ6 in FIG. 29 are always at 0 potential.

Thus, whereas the potentials of Φ5 and Φ6 change to $-V_B$ and $V_B$ respectively in the intervals (D1) and (E1) in FIG. 25 (the first example of control signals), the potentials remain at 0 in the corresponding intervals (D2) and (E2) in FIG. 29. This state has significance especially in FIG. 18D2. Even if the potentials of both Φ5 and Φ6 in FIG. 18D2 are 0, since the potential of Φ4 is $-V_B$ and the potential of Φ3 is $V_B$, there are both repellent force which pushes out signal polarization and attraction force which pulls out the signal polarization, from the first polarization accumulator to the second polarization accumulator via the upper electrodes, or there are electric fields which function similarly, moving the signal polarization from left to right.

Eighth Example of Control Signals

Figure 30:
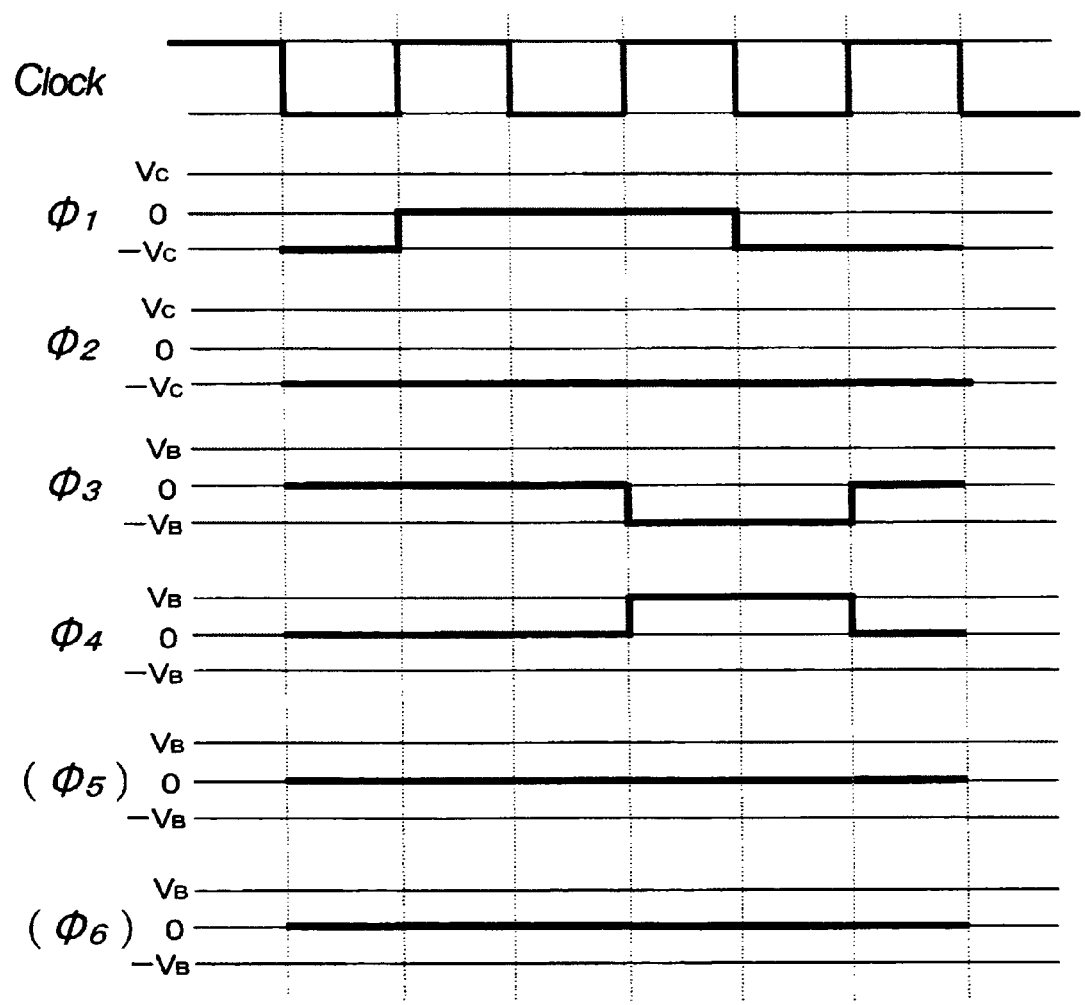
FIG. 30 is a diagram showing signal waveforms of an eighth example used to control the polarization transfer device according to the present invention.

FIG. 30 is a diagram showing an eighth example of signal waveforms applied to the polarization transfer device shown in FIG. 2 via the control signal lines.

Signal waveforms of Φ1, Φ2, Φ3, Φ4, Φ5, and Φ6 are shown in intervals (G2), (H2), (I2), (J2), (K2), and (L2) in FIG. 30 and states of the polarization transfer device in FIG. 2 in the intervals (G2) to (L2) are shown in FIGS. 19G2, 19H2, 19I2, 20J2, 20K2, and 20L2, respectively.

FIG. 30 differs from FIG. 26 (the second example of control signals) in Φ5 and Φ6. Specifically, the respective lower electrodes 113, 114, and 115 of the first, second, and third polarization switches as well as the respective lower electrodes 116 and 117 of the first and second polarization accumulators in FIG. 1 are replaced in FIG. 2 by the common electrode 118, which is fixed at the ground potential of 0. Consequently, Φ5 and Φ6 in FIG. 30 are always at 0 potential.

Thus, whereas the potentials of Φ5 and Φ6 change to $V_B$ and $-V_B$ respectively in the intervals (J1) and (K1) in FIG. 28 (the second example of control signals), the potentials remain at 0 in the corresponding intervals (J2) and (K2) in FIG. 30. This state has significance especially in FIG. 20J2. Even if the potentials of both Φ5 and Φ6 in FIG. 20J2 are 0, since the potential of Φ3 is $-V_B$ and the potential of Φ4 is $V_B$, there are both repellent force which pushes out signal polarization and attraction force which pulls out the signal polarization, from the second polarization accumulator to the first polarization accumulator via the upper electrodes, or there are electric fields which function similarly, moving the signal polarization from right to left.

Fourth Embodiment of Device Structure

Figure 8:
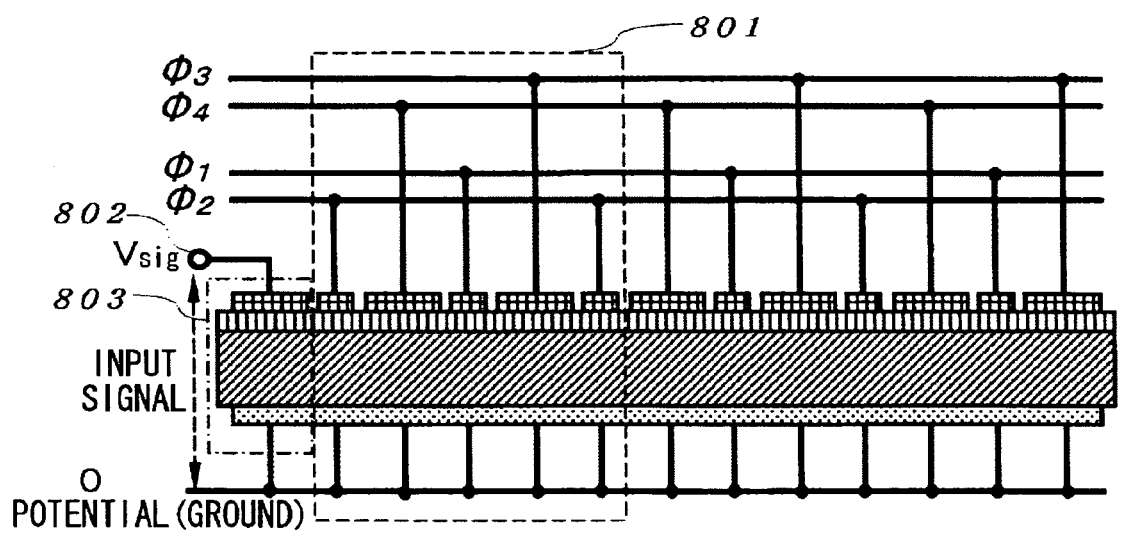
FIG. 8 is a sectional view showing a structure of a polarization transfer device according to a fourth embodiment of the present invention and at the same time a connection diagram showing a relationship with control signals.

FIG. 8 is a sectional view showing a structure of a polarization transfer device according to a fourth embodiment of the present invention and at the same time a connection diagram showing a relationship with control signals.

The polarization transfer device in FIG. 8 is basically a connected series of a plurality of the device structures according to the third embodiment in FIG. 2. In FIG. 8, the area surrounded by a broken line 801 shows a constitutional unit which corresponds to the polarization transfer device in FIG. 2. However, the first and third polarization switches in FIG. 2 can be shared when connected as shown in FIG. 8, which allows adjacent switches to be shared, and thus the first and third polarization switches in FIG. 8 are shown as being shared. In FIG. 8, reference numeral 802 denotes an input terminal which accepts an input signal as a voltage. The polarization transfer device in FIG. 8 uses non-volatile polarization of a ferroelectric thin film as a signal, but its input section handles signals in terms of voltage. When a positive voltage is applied to the input terminal 802, polarization corresponding to the input voltage occurs in a polarization input section 803. Subsequently, the polarization is transmitted successively through the linked structure of the polarization transfer device.

Incidentally, the polarization transfer device according to the fourth embodiment in FIG. 8 can be viewed as the polarization transfer device according to the second embodiment in FIG. 6 with a common electrode being used for the lower electrodes of all the polarization switches and polarization accumulators.

When the structure shown in FIG. 8 is compared with the structure shown in FIG. 6, since the lower electrode is wide and formed as a common electrode made of contiguous platinum (Pt), the ferroelectric thin film placed on it and made of PZTN has an affinity with the crystal axis of the platinum of the lower electrode. This facilitates crystal growth, resulting in highly reliable ferroelectric crystals with excellent electrical characteristics, and thus makes the polarization transfer device a more reliable product with a higher production stability than the second embodiment in FIG. 6.

Fifth Embodiment of Device Structure

FIG. 3 is a sectional view showing a structure of a polarization transfer device according to a fifth embodiment of the present invention and at the same time a connection diagram showing a relationship with control signals.

Basically, the device structure in FIG. 3 follows suit with the device structure in FIG. 2. It differs in that a paraelectric insulating layer 312 directly underneath the upper electrodes 123, 124, and 125 of the first, second, and third polarization switches is made of a material different from that of the paraelectric insulating layer 112 directly underneath the upper electrodes 126 and 127 of the first and second polarization accumulators. The paraelectric insulating layer 312 is made of a material which has a different relative dielectric constant from the paraelectric insulating layer 112 and has such characteristics that polarization movement in the ferroelectric thin film will occur when the potentials of the upper electrodes 123, 124, and 125 of the first, second, and third polarization switches are $+V_C$, but not when the potentials are 0. Thus, the potentials of the upper electrodes 123, 124, and 125 of the first, second, and third polarization switches are controlled to vary either between $-V_C$ and $+V_C$ or between 0 and $+V_C$. Then, by making full use of the non-volatility feature, polarized signals are stored reliably not only when the polarization transfer device is powered on, but also when it is powered off.

The fifth embodiment features almost the same structure, operation, and functionality as the third embodiment in FIG. 2 except that the paraelectric insulating layer directly underneath the upper electrodes of the polarization switches is made of a different material as described above.

Sixth Embodiment of Device Structure

Figure 9:
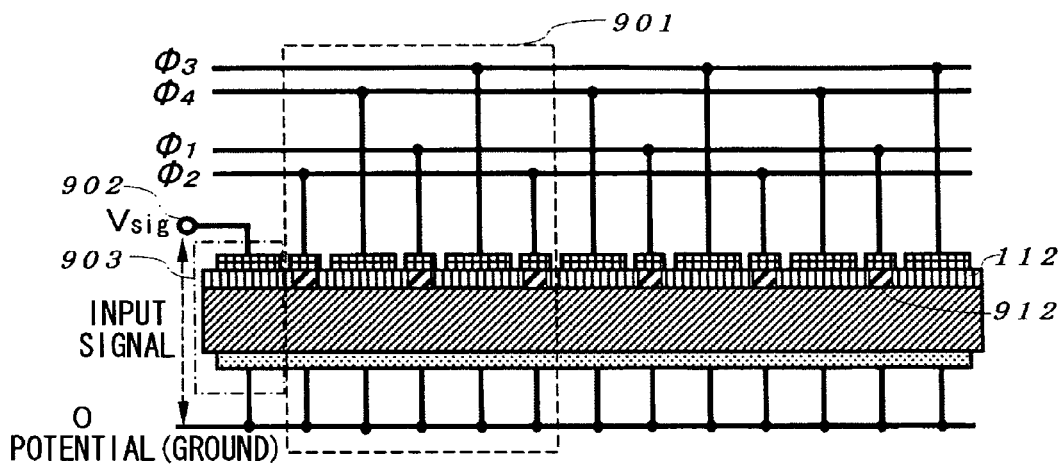
FIG. 9 is a sectional view showing a structure of a polarization transfer device according to a sixth embodiment of the present invention and at the same time a connection diagram showing a relationship with control signals.

FIG. 9 is a sectional view showing a structure of a polarization transfer device according to a sixth embodiment of the present invention and at the same time a connection diagram showing a relationship with control signals.

Basically, the device structure in FIG. 9 follows suit with the device structure in FIG. 8. It differs in that a paraelectric insulating layer 912 directly underneath the upper electrodes of polarization switches is made of a material different from that of the paraelectric insulating layer 112 directly underneath the upper electrodes of polarization accumulators. The paraelectric insulating layer 912 is made of a material which has a different relative dielectric constant from the paraelectric insulating layer 112 and has such characteristics that polarization movement in the ferroelectric thin film will occur when the potentials of the upper electrodes of the polarization switches are $+V_C$, but not when the potentials are 0. Thus, the potentials of the upper electrodes of the polarization switches are controlled to vary either between $-V_C$ and $+V_C$ or between 0 and $+V_C$. Thus, by making full use of the non-volatility feature, polarized signals are stored reliably not only when the polarization transfer device is powered on, but also when it is powered off.

Seventh Embodiment of Device Structure

Figure 7:
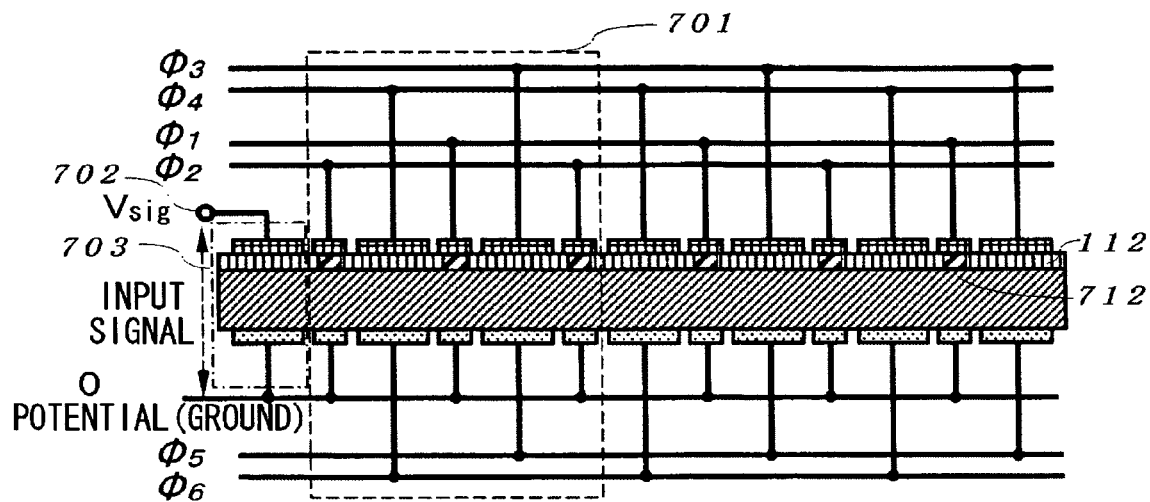
FIG. 7 is a sectional view showing a structure of a polarization transfer device according to a seventh embodiment of the present invention and at the same time a connection diagram showing a relationship with control signals.

FIG. 7 is a sectional view showing a structure of a polarization transfer device according to a seventh embodiment of the present invention and at the same time a connection diagram showing a relationship with control signals.

FIG. 7 is an application of the technique used in the fifth and sixth embodiments to the second embodiment in FIG. 6, where the technique involves the use of a different material for the paraelectric insulating layer 712 directly underneath the upper electrodes of polarization switches from the material of the paraelectric insulating layer 112 directly underneath the upper electrodes of polarization accumulators.

Specifically, in FIG. 7, a paraelectric insulating layer 712 directly underneath the upper electrodes of polarization switches is made of a material different from the paraelectric insulating layer 112 directly underneath the upper electrodes of polarization accumulators. The paraelectric insulating layer 712 is made of a material which has a different relative dielectric constant from that of the paraelectric insulating layer 112 and has such characteristics that polarization movement in the ferroelectric thin film will occur when the potentials of the upper electrodes of the polarization switches are $+V_C$, but not when the potentials are 0. Thus, the potentials of the upper electrodes of the polarization switches are controlled to vary either between $-V_C$ and $+V_C$ or between 0 and $+V_C$. Thus, by making full use of the non-volatility feature, polarized signals are stored reliably not only when the polarization transfer device is powered on, but also when it is powered off.

Eighth Embodiment of Device Structure

FIG. 4 is a sectional view showing a structure of a polarization transfer device according to an eighth embodiment of the present invention and at the same time a connection diagram showing a relationship with control signals.

Basically, the device structure in FIG. 4 is a high-density version of the device structure according to the third embodiment in FIG. 2. FIG. 4 differs from FIG. 2 in that respective upper electrodes 423, 424, and 425 of the first, second, and third polarization switches are formed in a different layer by a different manufacturing process from the upper electrodes 126 and 127 of the first and second polarization accumulators. Also, in FIG. 4, the upper electrodes 126 and 127 of the first and second polarization accumulators are formed at a shorter distance. Otherwise, the polarization transfer device in FIG. 4 has almost the same structure and uses the same method of control as the polarization transfer device in FIG. 2.

In FIG. 4, reference numeral 119 denotes an insulating layer made of $SiO_2$, NiO, or the like. The respective upper electrodes 423, 424, and 425 of the first, second, and third polarization switches are provided above the upper electrodes 126 and 127 of the first and second polarization accumulators via the insulating layer 119. Since the upper electrode 424 of the second polarization switch has been moved upward, the respective upper electrodes 126 and 127 of the first and second polarization accumulators are brought closer to each other so that the distance between them will be equal to the metal width of the upper electrode 424 of the second polarization switch. The upper electrodes of the polarization switches control the polarization of the ferroelectric thin film through clearances at the sides of the upper electrodes of the polarization accumulators. In so doing, a little higher control voltage is used as a control voltage than that in FIG. 2. Also, in FIG. 4, since the respective upper electrodes 423, 424, and 425 of the first, second, and third polarization switches cover the clearances at the sides of the respective upper electrodes 126 and 127 of the first and second polarization accumulators, the states of the paraelectric insulating layer 112 and the ferroelectric thin film 111 can be controlled reliably by control signals using the respective upper electrodes 423, 424, and 425 of the first, second, and third polarization switches as well as the respective upper electrodes 126 and 127 of the first and second polarization accumulators. Also, as described above, since the respective upper electrodes 126 and 127 of the first and second polarization accumulators can be brought closer to each other in the embodiment in FIG. 4 than in FIG. 2, it is possible to increase packing density as well as efficiency of transfer between the first and second polarization accumulators.

This makes it possible to provide a polarization transfer device which feature high packing density, high transfer efficiency, and good controllability of polarization movement and polarization retention.

Ninth Embodiment of Device Structure

Figure 10:
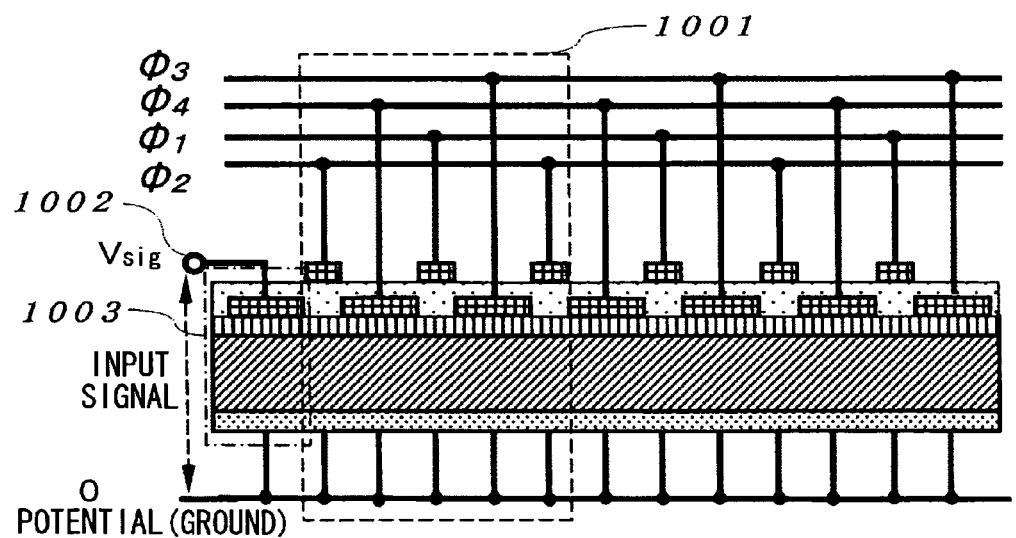
FIG. 10 is a sectional view showing a structure of a polarization transfer device according to a ninth embodiment of the present invention and at the same time a connection diagram showing a relationship with control signals.

FIG. 10 is a sectional view showing a structure of a polarization transfer device according to a ninth embodiment of the present invention and at the same time a connection diagram showing a relationship with control signals.

The polarization transfer device in FIG. 10 is basically a connected series of a plurality of the device structures according to the eighth embodiment in FIG. 4.

In FIG. 10, the area surrounded by a broken line 1001 shows a constitutional unit which corresponds to the polarization transfer device in FIG. 4. However, the first and third polarization switches in FIG. 4 can be shared when connected as shown in FIG. 10, which allows adjacent switches to be shared, and thus the first and third polarization switches in FIG. 10 are shown as being shared. In FIG. 10, reference numeral 1002 denotes an input terminal which accepts an input signal as a voltage. The polarization transfer device in FIG. 10 uses non-volatile polarization of a ferroelectric thin film as a signal, but its input section handles signals in terms of voltage. When a positive voltage is applied to the input terminal 1002, polarization corresponding to the input voltage occurs in a polarization input section 1003. Subsequently, the polarization is transmitted successively through the linked structure of the polarization transfer device.

Incidentally, the polarization transfer device according to the ninth embodiment in FIG. 10 can be viewed as the polarization transfer device according to the fourth embodiment in FIG. 8 with the upper electrodes of the polarization switches being formed in an upper layer separately from the upper electrodes of the polarization accumulators.

When the structure shown in FIG. 10 is compared with the structure shown in FIG. 8, the polarization accumulators are closer to each other, and thus the structure in FIG. 10 can improve packing density and transfer efficiency.

Also, since the upper electrodes of the polarization switches in FIG. 10 cover the space between the upper electrodes of the polarization accumulators, the structure in FIG. 10 features better controllability of the polarization switches than does the structure in FIG. 8.

Tenth Embodiment of Device Structure

Figure 5:
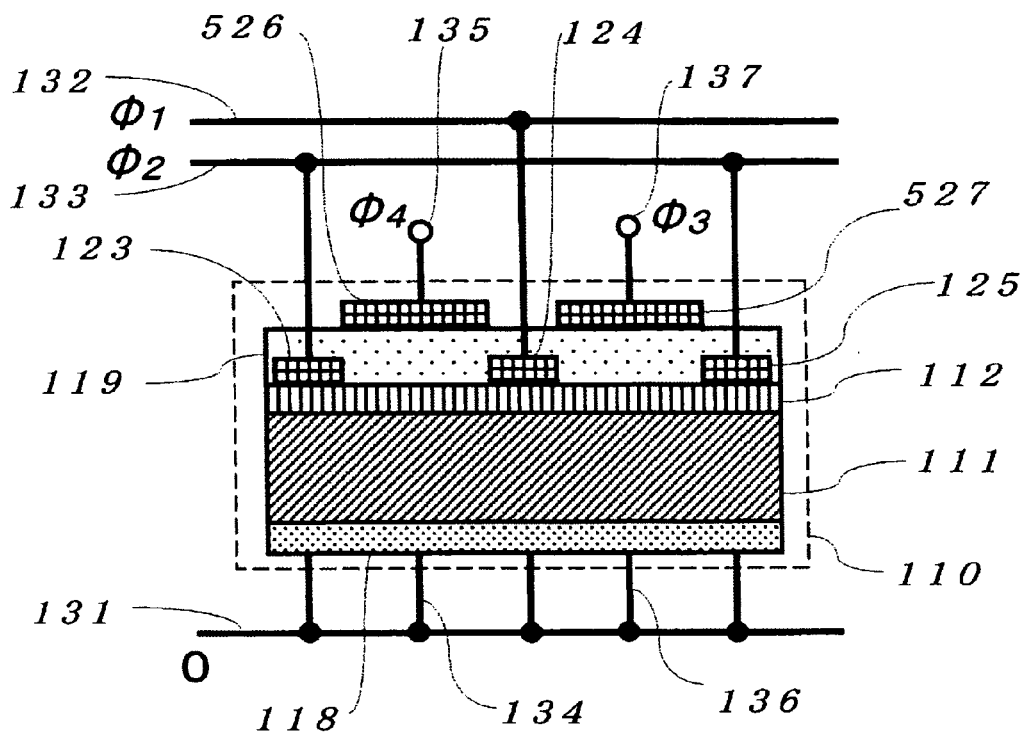
FIG. 5 is a sectional view showing a structure of a polarization transfer device according to a tenth embodiment of the present invention and at the same time a connection diagram showing a relationship with control signals.

FIG. 5 is a sectional view showing a structure of a polarization transfer device according to a tenth embodiment of the present invention and at the same time a connection diagram showing a relationship with control signals.

The structure in FIG. 5 is the same as the structure according to the eighth embodiment in FIG. 4 except that vertical relationship are exchanged between the upper electrodes of the polarization switches and upper electrodes of the polarization accumulators. That is, in FIG. 5, the upper electrodes 123, 124, and 125 of the first, second, and third polarization switches are mounted directly on the paraelectric insulating layer 112 and the upper electrodes 526 and 527 of the first and second polarization accumulators are placed on the insulating layer 119.

Since the structure in FIG. 5 differs from the structure in FIG. 4 only in the vertical relationship between the upper electrodes of the polarization switches and upper electrodes of the polarization accumulators, it inherits high packing density, high transfer efficiency, and good controllability of polarization movement and polarization retention as they are from the polarization transfer device according to the eighth embodiment in FIG. 4. Furthermore, since the upper electrodes of the polarization switches are closer to the ferroelectric thin film than in the structure in FIG. 4, the structure in FIG. 5 has a feature much improved in view of controllability of the polarization switches.

Eleventh Embodiment of Device Structure

Figure 11:
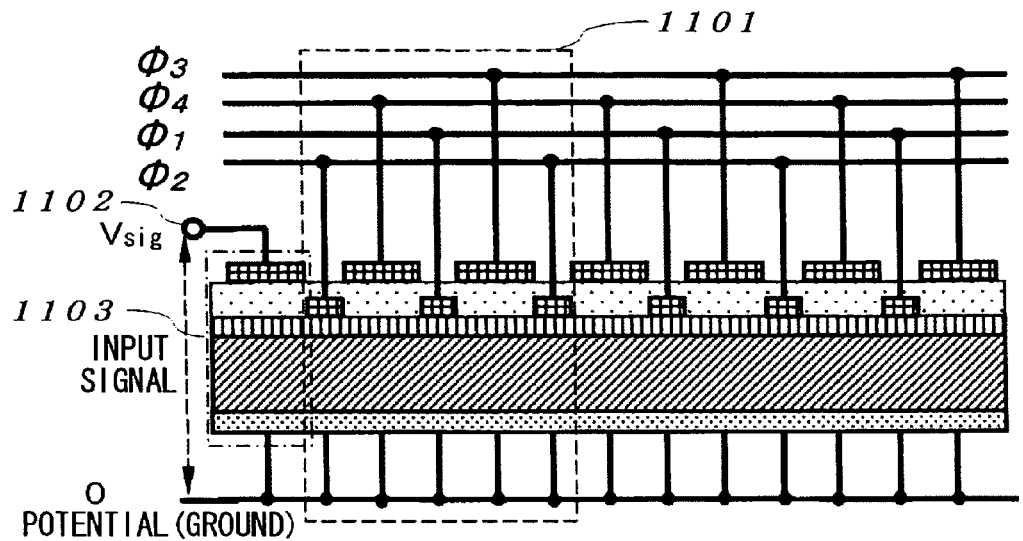
FIG. 11 is a sectional view showing a structure of a polarization transfer device according to an eleventh embodiment of the present invention and at the same time a connection diagram showing a relationship with control signals.

FIG. 11 is a sectional view showing a structure of a polarization transfer device according to an eleventh embodiment of the present invention and at the same time a connection diagram showing a relationship with control signals.

The polarization transfer device in FIG. 11 is basically a connected series of a plurality of the device structures according to the tenth embodiment in FIG. 5. In FIG. 11, the area surrounded by a broken line 1101 shows a constitutional unit which corresponds to the polarization transfer device in FIG. 5. However, the first and third polarization switches in FIG. 5 can be shared when connected as shown in FIG. 11, which allows adjacent switches to be shared, and thus the first and third polarization switches in FIG. 11 are shown as being shared. In FIG. 11, reference numeral 1102 denotes an input terminal which accepts an input signal as a voltage. The polarization transfer device in FIG. 11 uses non-volatile polarization of a ferroelectric thin film as a signal, but its input section handles signals in terms of voltage. When a positive voltage is applied to the input terminal 1102, polarization corresponding to the input voltage occurs in a polarization input section 1103. Subsequently, the polarization is transmitted successively through the linked structure of the polarization transfer device.

Incidentally, since the polarization transfer device according to the eleventh embodiment in FIG. 11 can be viewed as the polarization transfer device according to the ninth embodiment in FIG. 10 with vertical relationship being exchanged between the upper electrodes of the polarization switches and upper electrodes of the polarization accumulators, it inherits high packing density, high transfer efficiency, and good controllability of polarization movement and polarization retention as they are from the polarization transfer device according to the ninth embodiment in FIG. 10. Furthermore, since the upper electrodes of the polarization switches are closer to the ferroelectric thin film than in the structure in FIG. 10, the structure in FIG. 11 has a feature much improved in view of controllability of the polarization switches.

Ninth Example of Control Signals

FIG. 26 is a diagram showing a ninth example of signal waveforms applied to the polarization transfer device according to the fifth, eighth, or tenth embodiment in FIG. 3, 4, or 5 via the control signal lines.

The signal waveforms on the control signal lines in FIG. 26 differ from those according to the first example of the control signals in FIG. 25 in that the control signals Φ1 and Φ2 for the upper electrodes of the polarization switches are controlled to vary between potentials of 0 and $+V_C$ in FIG. 26 while they are controlled to vary between potentials of $-V_C$ and 0 in FIG. 25. An appropriate range of the control voltage for polarization switches depends on the material and thickness of the ferroelectric thin film or paraelectric insulating layer, but generally the control voltage in FIG. 26 allows higher retention and non-volatility of polarization than the control voltage in FIG. 25.

Tenth Example of Control Signals

Figure 27:
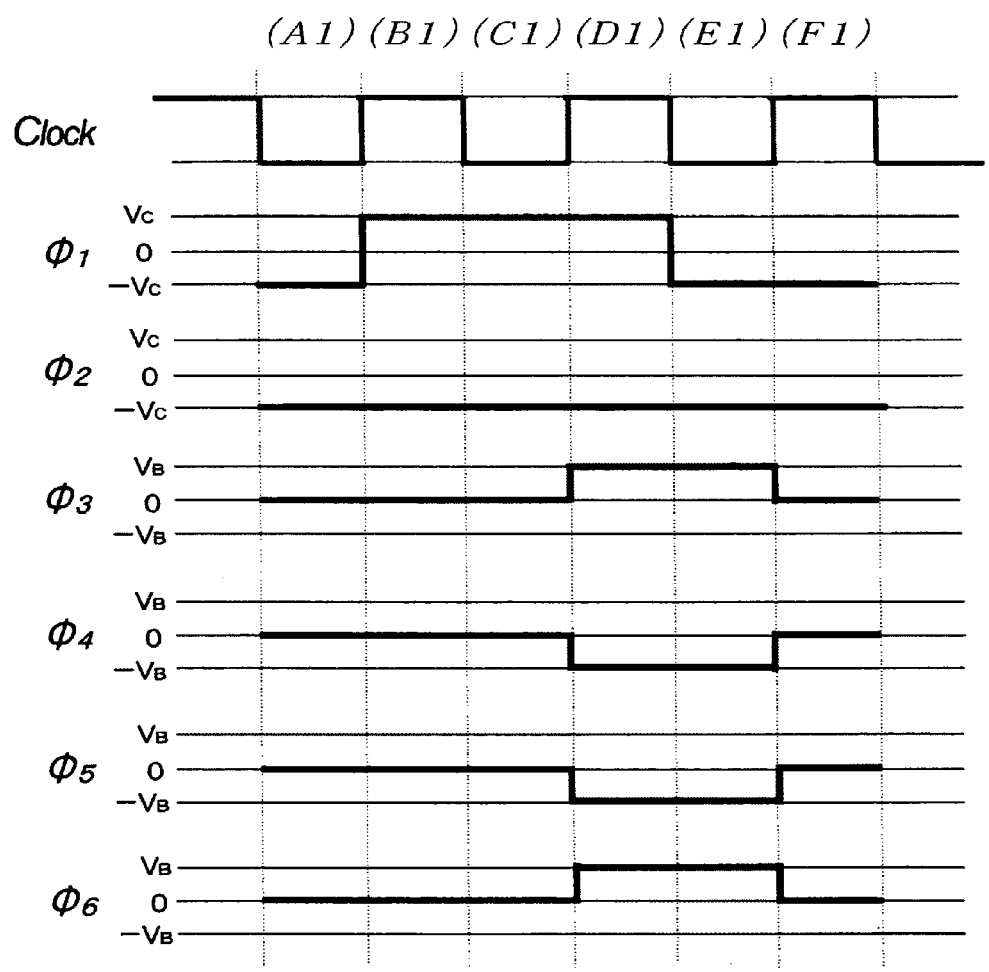
FIG. 27 is a diagram showing signal waveforms of a tenth example used to control the polarization transfer device according to the present invention.

FIG. 27 is a diagram showing a tenth example of signal waveforms applied to the polarization transfer device according to the fifth, eighth, or tenth, embodiment in FIG. 3, 4, or 5 via the control signal lines.

The signal waveforms on the control signal lines in FIG. 27 differ from those according to the first example of the control signals in FIG. 25 or ninth example of the control signals in FIG. 26 in that the control signals Φ1 and Φ2 for the upper electrodes of the polarization switches are controlled to vary between potentials of $-V_C$ and $+V_C$ in FIG. 27 while they are varied between potentials of $-V_C$ and 0 in FIG. 25 and between potentials of 0 and $+V_C$ in FIG. 26. An appropriate range of the control voltage for polarization switches depends on the material and thickness of the ferroelectric thin film or paraelectric insulating layer, but generally the control voltage in FIG. 27 allows higher retention and non-volatility of polarization than the control voltage in FIG. 25 or 26.

Eleventh Example of Control Signals

Figure 35:
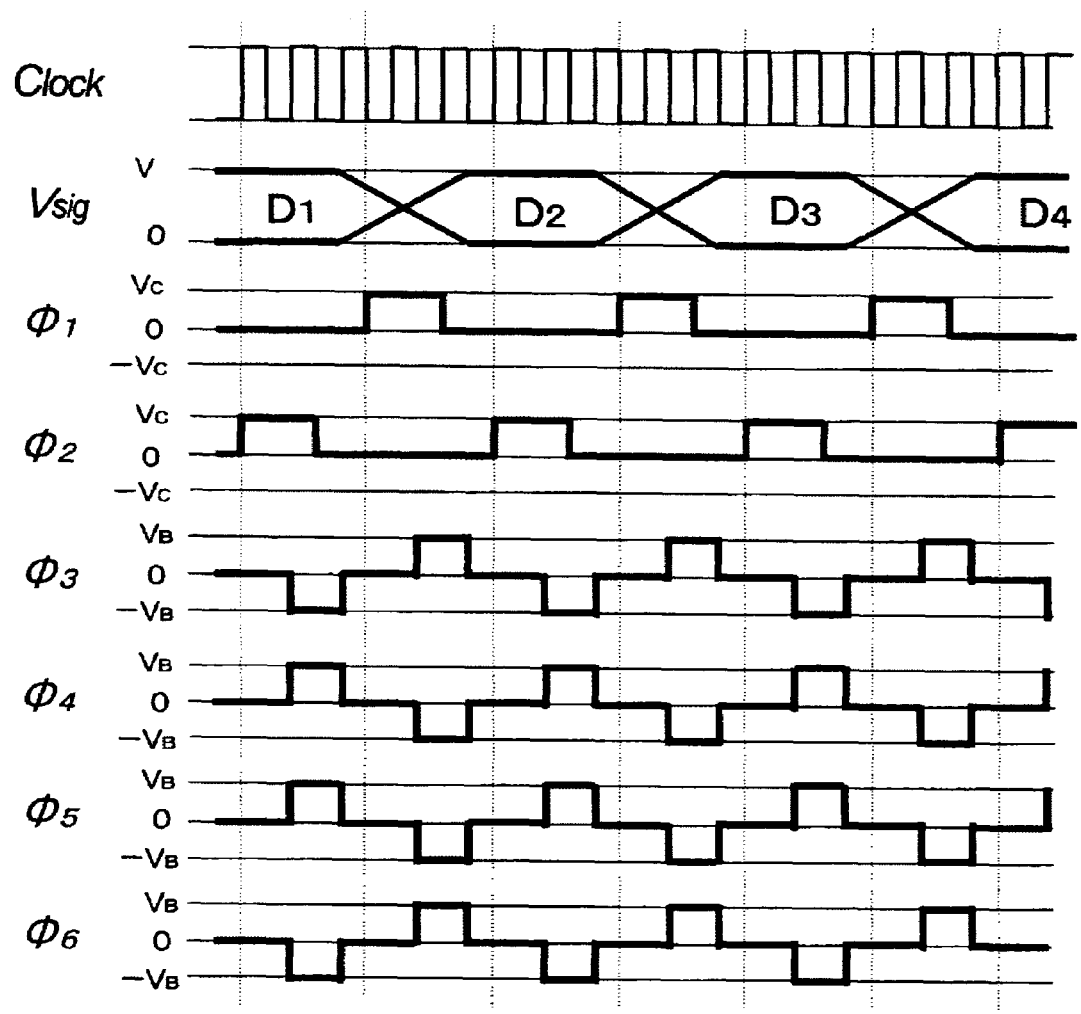
FIG. 35 is a diagram showing signal waveforms of an eleventh example used to control the polarization transfer device according to the present invention.

FIG. 35 is a diagram showing an eleventh example of signal waveforms applied to the polarization transfer device according to the seventh, sixth, ninth, or eleventh embodiment in FIG. 7, 9, 10, or 11 via the control signal lines.

The signal waveforms on the control signal lines in FIG. 35 differ from those according to the fifth example of the control signals in FIG. 33 in that the control signals Φ1 and Φ2 for the upper electrodes of the polarization switches are controlled to vary between potentials of 0 and $+V_C$ in FIG. 35 while they are controlled to vary between potentials of $-V_C$ and 0 in FIG. 33. An appropriate range of the control voltage for polarization switches depends on the material and thickness of the ferroelectric thin film or paraelectric insulating layer, but generally the control voltage in FIG. 35 allows higher retention characteristics and non-volatility of polarization than the control voltage in FIG. 33.

Twelfth Example of Control Signals

Figure 36:
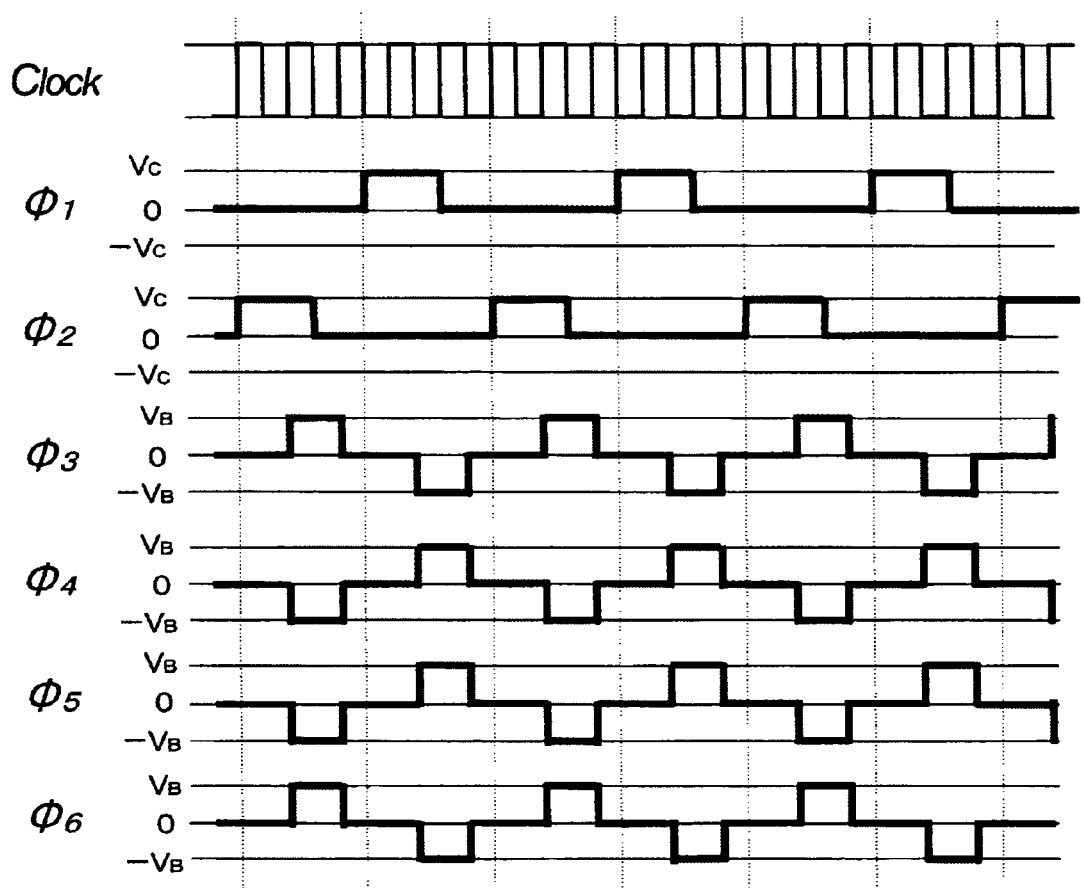
FIG. 36 is a diagram showing signal waveforms of a twelfth example used to control the polarization transfer device according to the present invention.

FIG. 36 is a diagram showing a twelfth example of signal waveforms applied to the polarization transfer device according to the seventh, sixth, ninth, or eleventh embodiment in FIG. 7, 9, 10, or 11 via the control signal lines.

The signal waveforms on the control signal lines in FIG. 36 differ from those according to the sixth example of the control signals in FIG. 34 in that the control signals Φ1 and Φ2 for the upper electrodes of the polarization switches are controlled to vary between potentials of 0 and $+V_C$ in FIG. 36 while they are controlled to vary between potentials of $-V_C$ and 0 in FIG. 34. An appropriate range of the control voltage for polarization switches depends on the material and thickness of the ferroelectric thin film or paraelectric insulating layer, but generally the control voltage in FIG. 36 allows higher retention and non-volatility of polarization than the control voltage in FIG. 34.

Thirteenth Example of Control Signals

Figure 37:
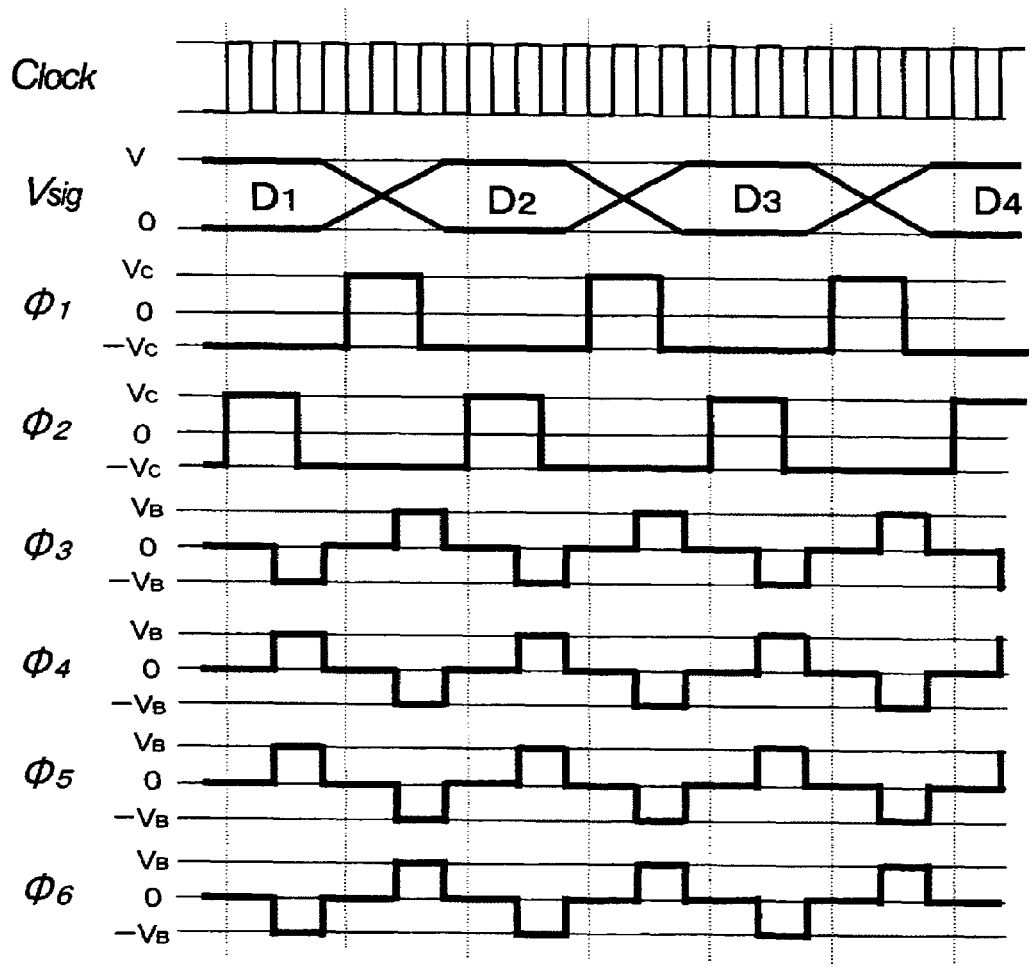
FIG. 37 is a diagram showing signal waveforms of a thirteenth example used to control the polarization transfer device according to the present invention.

FIG. 37 is a diagram showing a thirteenth example of signal waveforms applied to the polarization transfer device according to the seventh, sixth, ninth, or eleventh embodiment in FIG. 7, 9, 10, or 11 via the control signal lines.

The signal waveforms on the control signal lines in FIG. 37 differ from those according to the fifth example of the control signals in FIG. 33 or eleventh example of the control signals in FIG. 35 in that the control signals Φ1 and Φ2 for the upper electrodes of the polarization switches are controlled to vary between potentials of $-V_C$ and $+V_C$ in FIG. 37 while they are varied between potentials of $-V_C$ and 0 in FIG. 33 and between potentials of 0 and $+V_C$ in FIG. 35. An appropriate range of the control voltage for polarization switches depends on the material and thickness of the ferroelectric thin film or paraelectric insulating layer, but generally the control voltage in FIG. 37 allows higher retention and non-volatility of polarization than the control voltage in FIG. 33 or 35.

Fourteenth Example of Control Signals

Figure 38:
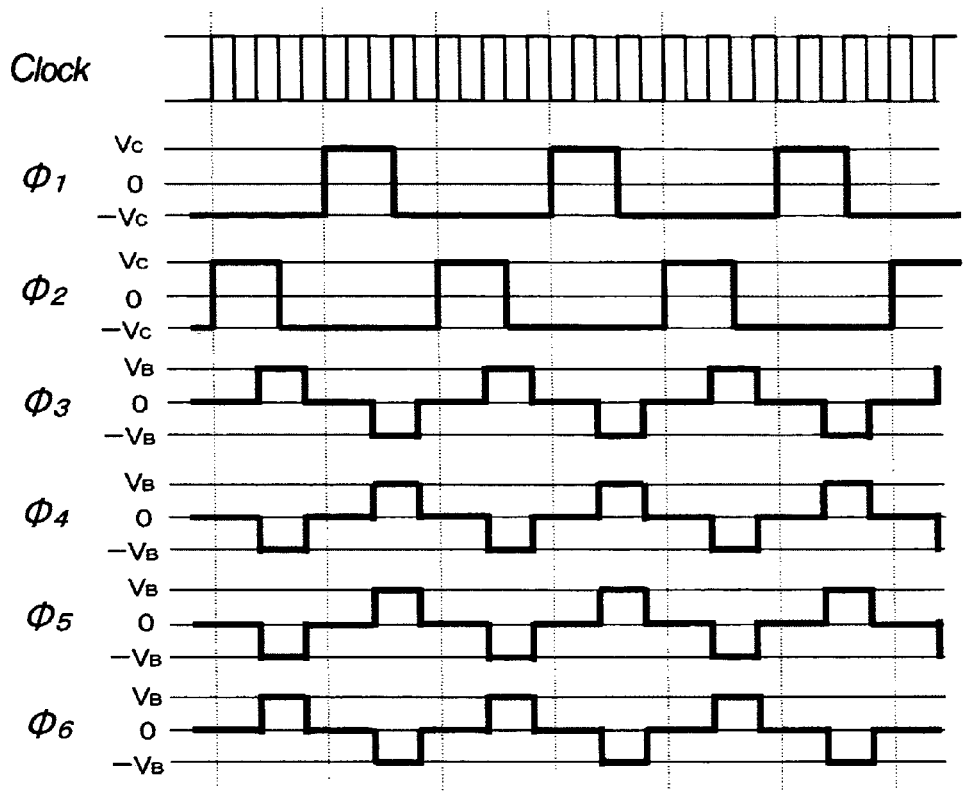
FIG. 38 is a diagram showing signal waveforms of a fourteenth example used to control the polarization transfer device according to the present invention.

FIG. 38 is a diagram showing a fourteenth example of signal waveforms applied to the polarization transfer device according to the seventh, sixth, ninth, or eleventh embodiment in FIG. 7, 9, 10, or 11 via the control signal lines.

The signal waveforms on the control signal lines in FIG. 38 differ from those according to the sixth example of the control signals in FIG. 34 or twelfth example of the control signals in FIG. 36 in that the control signals Φ1 and Φ2 for the upper electrodes of the polarization switches are controlled to vary between potentials of $-V_C$ and $+V_C$ in FIG. 38 while they are controlled to vary between potentials of $-V_C$ and 0 in FIG. 34 and between potentials of 0 and $+V_C$ in FIG. 36. An appropriate range of the control voltage for polarization switches depends on the material and thickness of the ferroelectric thin film or paraelectric insulating layer, but generally the control voltage in FIG. 38 allows higher retention and non-volatility of polarization than the control voltage in FIG. 34 or 36.

Other Embodiments

The present invention is not limited to the embodiments described above, and other embodiments will be listed below.

Input signals of positive polarity have been cited above and waveforms of the control signals Φ1, Φ2, Φ3, Φ4, Φ5, and Φ6 have been presented in combinations suitable for the input signals, but there are also suitable combinations of waveforms of the control signals Φ1, Φ2, Φ3, Φ4, Φ5, and Φ6 even if input signals are of negative polarity. Waveforms of the control signals Φ1, Φ2, Φ3, Φ4, Φ5, and Φ6 can be combined in such a way as to generate an electric field which will move signal polarization leftward or rightward.

Although a method which involves applying a fixed 0 potential to the lower electrodes of the polarization switches has been described above, there is also a method which applies positive or negative potentials to the individual lower electrodes to enhance a switching function of the polarization switches.

Also, although in the above examples, the control voltages applied to the terminals of the polarization switches are $-V_C$, 0, and $+V_C$, and the control voltages applied to the terminals of the polarization accumulators are $-V_B$, 0, and $+V_B$, the absolute values of the positive and negative potentials may not be equal to each other.

Also, although in the above embodiments, both polarization switches and polarization accumulators have upper and lower electrodes, their electrodes may be arranged horizontally rather than vertically.

Also, although PZTN, PZT, and SBT have been cited as examples of ferroelectric materials, the present invention may use other ferroelectric materials such as BLT ($Bi_{4-x}La_xTi_3O_{12}$), $BaTiO_3$, $SrTiO_3$, $Bi_4Ti_3O_{12}$, and $BaBiNb_2O_9$. There can be an infinite number of materials if the proportions of the constituents are changed. Besides, an upper layer and lower layer of different ferroelectric materials may be laminated.

Also, although in the first to seventh embodiments of the device structure in FIGS. 1 to 11, the paraelectric insulating layer 112 made of NiO (nickel oxide) is provided between the ferroelectric thin film 111 and upper electrodes (123 to 127), it may be provided between the ferroelectric thin film 111 and lower electrodes (113 to 118), provided that such material and manufacturing process that will not hinder crystal growth of the ferroelectric thin film 111 can be selected. This is expected to improve polarization movement and transfer efficiency.

Also, although in the first to seventh embodiments of the device structure in FIGS. 1 to 7, the paraelectric insulating layer 112 made of NiO (nickel oxide) is provided between the ferroelectric thin film 111 and upper electrodes (123 to 127), this is not absolutely necessary requirement. The paraelectric insulating layer 112 is provided to remove the polarization domain wall between different polarizations in the ferroelectric thin film 111 or facilitate its movement by means of induced charge or the potential of the upper electrodes. Thus, the polarization domain wall may be removed or moved even without the paraelectric insulating layer 112 if the ferroelectric thin film 111 is made of an appropriate material, is multilayered, or is otherwise constructed ingeniously or an appropriate potential is applied to the upper electrodes.

Also, although in FIGS. 3, 7, and 9, the paraelectric insulating layer directly underneath the upper electrodes of the polarization switches and paraelectric insulating layer directly underneath the upper electrodes of the polarization accumulators are made of different materials while in FIGS. 4, 5, 10, and 11, the upper electrodes of the polarization switches and the upper electrodes of the polarization accumulators are constructed in different layers, the two methods may be used in combination.

Also, although a ferroelectric memory has been cited as an application example of the polarization transfer device according to the present invention, the polarization transfer device, which is a non-volatile signal storage/transfer device in principle, is expected to find many other applications as a non-volatile delay element.

Also, although ferroelectric memories use digital signals of 1 and 0 in principle, the polarization transfer device according to the present invention can also handle analog signals or multilevel signals.

What is claimed is:

1. A transfer control method for controlling a polarization transfer device including: a ferroelectric thin film formed continuously as one piece; a plurality of polarization switches formed by placing the ferroelectric thin film between a plurality of first gate electrodes that are each connected to a ground, and a plurality of second gate electrodes that are each alternatively connected to a first or a second control signal; and a plurality of polarization accumulators formed by placing the ferroelectric thin film between a plurality of first electrode plates that are each alternatively connected to a third or a fourth control signal, and a plurality of second electrode plates that are each alternatively connected to a fifth or sixth control signal, wherein the plurality of polarization switches and the plurality of polarization accumulators are arranged alternately, the method comprising:

applying at least one of the first, second, third, fourth, fifth and sixth control signals in sync with a clock to the plurality of polarization switches and the plurality of polarization accumulators that are alternatively arranged on the ferroelectric thin film;

applying a first control voltage controlled by at least one of the first and second control signals to each corresponding second gate electrode of the plurality of polarization switches; and applying a second control voltage controlled by at least one of the third, fourth, fifth and sixth control signals to each corresponding first electrode plate and second electrode plate of the plurality of polarization accumulators such that the first control voltage and the second control voltage are not higher than a coercive voltage of the ferroelectric thin film.

2. A transfer control method for controlling the polarization transfer device according to claim 1, wherein at least one first gate electrode and at least one first electrode plate are formed as a continuous common electrode.

3. A transfer control method for controlling a polarization transfer device including: a ferroelectric thin film formed continuously as one piece; a plurality of polarization switches formed by placing the ferroelectric thin film between a plurality of first gate electrodes that are each connected to a ground, and a plurality of second gate electrodes that are each alternatively connected to a first or a second control signal; and a plurality of polarization accumulators formed by placing the ferroelectric thin film between a plurality of first electrode plates that are each alternatively connected to a third or a fourth control signal, and a plurality of second electrode plates that are each alternatively connected to fifth or a sixth control signal, wherein the plurality of polarization switches and the plurality of polarization accumulators are arranged alternately, the method comprising:

applying at least one of the third, fourth, fifth or sixth control signals so as to apply a voltage to each corresponding first electrode plate and second electrode plate of adjacent first and second polarization accumulators among the plurality of polarization accumulators in such a way that a polarization charge of the ferroelectric thin film is attracted or repelled in a direction of transfer of the voltage.

4. A transfer control method for controlling the polarization transfer device according to claim 3, wherein at least one first gate electrode and at least one first electrode plate are formed as a continuous common electrode.

* * * * *